United States Patent
Ino et al.

(10) Patent No.: US 9,691,973 B2
(45) Date of Patent: Jun. 27, 2017

(54) SEMICONDUCTOR DEVICE AND DIELECTRIC FILM INCLUDING A FLUORITE-TYPE CRYSTAL

(71) Applicant: Kabushiki Kaisha Toshiba, Minato-ku (JP)

(72) Inventors: Tsunehiro Ino, Fujisawa (JP); Riichiro Takaishi, Kawasaki (JP); Koichi Kato, Yokohama (JP); Yasushi Nakasaki, Yokohama (JP); Takamitsu Ishihara, Yokohama (JP); Daisuke Matsushita, Fujisawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/843,050

(22) Filed: Sep. 2, 2015

(65) Prior Publication Data

US 2015/0380641 A1    Dec. 31, 2015

Related U.S. Application Data

(63) Continuation of application No. PCT/JP2014/069368, filed on Jul. 22, 2014.

(30) Foreign Application Priority Data

Sep. 25, 2013  (JP) .................................. 2013-197703

(51) Int. Cl.
*H01L 45/00* (2006.01)
*G11C 11/22* (2006.01)
(Continued)

(52) U.S. Cl.
CPC .............. *H01L 45/06* (2013.01); *C01G 25/02* (2013.01); *C01G 27/00* (2013.01); *C01G 27/02* (2013.01);
(Continued)

(58) Field of Classification Search
CPC ................ H01L 45/06; H01L 29/7843; H01L 29/78391; H01L 45/1253; H01L 27/1159;
(Continued)

(56) References Cited

U.S. PATENT DOCUMENTS 5,340,796 A * 8/1994 Cava ................... C04B 35/4521
                                                           252/519.1
5,810,923 A * 9/1998 Yano ....................... C30B 23/02
                                                           117/84
(Continued)

FOREIGN PATENT DOCUMENTS

JP    10-093050 A    4/1998
JP    11-087634 A    3/1999
(Continued)

OTHER PUBLICATIONS

John E. Ellis et al., "Synthesis, Isolatikn, and Characterization of [K(crptand 2.2.2)]sub2[Hf(CO0sub6], the First Substance to Contain Hafnium in a Negative Oxidation State. Structural Characterization of [K(cryptand 2.2.2)]sub2 Pyridine (M=Ti, Zr, and Hf)", Journal of American Chemical Society, vol. 112. 1990 pp. 6022-6025.*

(Continued)

*Primary Examiner* — William Coleman
(74) *Attorney, Agent, or Firm* — Oblon, McClelland, Maier & Neustadt, L.L.P.

(57) ABSTRACT

A semiconductor device according to an embodiment includes a first conductive layer, a second conductive layer, and a dielectric film provided between the first and the second conductive layers. The dielectric film including a fluorite-type crystal and a positive ion site includes Hf and/or Zr, and a negative ion site includes O. In the dielectric film, parameters a, b, c, p, x, y, z, u, v and w satisfy a predetermined relation. The axis length of the a-axis, b-axis and c-axis of the original unit cell is a, b, and c, respectively.

(Continued)

An axis in a direction with no reversal symmetry is c-axis, a stacking direction of atomic planes of two kinds formed by negative ions disposed at different positions is a-axis, the remainder is b-axis. The parameters x, y, z, u, v and w are values represented using the parameter p.

14 Claims, 11 Drawing Sheets

(51) Int. Cl.
H01L 27/11507 (2017.01)
H01L 27/11514 (2017.01)
H01L 49/02 (2006.01)
H01L 27/1159 (2017.01)
H01L 27/11597 (2017.01)
H01L 29/78 (2006.01)
C01G 25/02 (2006.01)
C01G 27/00 (2006.01)
C01G 27/02 (2006.01)
H01L 29/51 (2006.01)

(52) U.S. Cl.
CPC .......... G11C 11/22 (2013.01); H01L 27/1159 (2013.01); H01L 27/11507 (2013.01); H01L 27/11514 (2013.01); H01L 27/11597 (2013.01); H01L 28/40 (2013.01); H01L 29/516 (2013.01); H01L 29/7843 (2013.01); H01L 29/78391 (2014.09); H01L 45/04 (2013.01); H01L 45/1233 (2013.01); H01L 45/1253 (2013.01); H01L 45/145 (2013.01); H01L 45/146 (2013.01)

(58) Field of Classification Search
CPC ......... H01L 27/11597; H01L 27/11507; H01L 45/1233; H01L 28/40; H01L 45/145; H01L 45/04; C01G 27/00; C01G 27/02; C01G 25/02; G11C 11/22
See application file for complete search history.

(56) References Cited

U.S. PATENT DOCUMENTS

| | | | | |
|---|---|---|---|---|
| 5,914,068 A * | 6/1999 | Hiratani | ................ | C04B 35/453 117/4 |
| 6,151,240 A * | 11/2000 | Suzuki | .................... | H01L 28/55 257/295 |
| 6,531,325 B1 | 3/2003 | Hsu et al. | | |
| 6,632,539 B1 * | 10/2003 | Iijima | .................... | C01G 25/00 427/62 |
| 7,273,657 B2 * | 9/2007 | Atanackovic | .......... | B82Y 20/00 257/E21.267 |
| 8,765,220 B2 * | 7/2014 | Dussarrat | .......... | H01L 21/02181 427/255.29 |
| 2004/0028952 A1 | 2/2004 | Cartier et al. | | |
| 2004/0136891 A1 | 7/2004 | Kijima et al. | | |
| 2005/0161773 A1 * | 7/2005 | Atanackovic | .......... | B82Y 20/00 257/632 |
| 2008/0087890 A1 * | 4/2008 | Ahn | .................... | C23C 16/405 257/43 |
| 2009/0194797 A1 * | 8/2009 | Shimizu | ........... | H01L 21/28194 257/288 |
| 2009/0261395 A1 * | 10/2009 | Boescke | ................. | G11C 11/22 257/295 |
| 2009/0315001 A1 * | 12/2009 | Campet | .................. | C04B 35/453 252/519.12 |
| 2013/0213263 A1 * | 8/2013 | Lee | .......... | C23C 14/08 106/286.2 |
| 2014/0145302 A1 * | 5/2014 | Hong | ................. | H01L 23/5223 257/532 |
| 2014/0264750 A1 * | 9/2014 | Chang | ................ | H01L 27/0629 257/533 |
| 2015/0048483 A1 * | 2/2015 | Kuo | ........................ | H01L 28/60 257/532 |
| 2015/0214322 A1 * | 7/2015 | Mueller | .................. | G11C 11/22 257/295 |
| 2015/0311435 A1 * | 10/2015 | Liu | ..................... | H01L 45/1233 257/4 |
| 2015/0340372 A1 * | 11/2015 | Pandey | .............. | H01L 27/1159 257/295 |

FOREIGN PATENT DOCUMENTS

| | | |
|---|---|---|
| JP | 2004-015047 A | 1/2004 |
| JP | 2004-161602 A | 6/2004 |
| JP | 2006-196828 A | 7/2006 |
| JP | 2007-042787 A | 2/2007 |
| JP | 2007-099618 A | 4/2007 |
| JP | 2009-070926 A | 4/2009 |
| JP | 2015-015334 A | 1/2015 |
| WO | WO 02/32809 A1 | 4/2002 |

OTHER PUBLICATIONS

Alexandra Navrotsky, "Thermochemical insights into refractory ceramic materials based on oxides with large tetravalent cations", Jounal of Materials Chemistry, The Royal Society of Chemistry, Mar. 4, 2005, pp. 1883-1890.*
G-M Rignanese, "Dielectric properties of crystalline and amorphous transition metal oxides and silicates as potential high-k candidtates: the contribution of density-functional theory", Journal of Physics: Condensed Matter, Institute of Physics Publishing, vol. 17, 2005, pp. R357-R379.*
J. H. Choi et al., "Development of hafnium based high-k materials—A review", Materials Science and Engineering R 72, 2011, pp. 97-136.*
Alexandra Navrotski, "Thermochemical insights into refractory ceramic materials based on oxides with large tetravalent cations", Journal of Materials Chemistry, The Royal Society of Chemistry 2005, vol. 15, 2005, pp. 1883-1890.*
Haggerty et al., "Thermal Expansion of HfO2 and ZrO2" Journal of American Ceramics, vol. 97 [7], 2014, pp. 2213-2222.*
J.M. Leger et al., "Pressure-induced phase transitions and volume changes in HfO2 up to 50 GPa", Physical Review B, vol., 48, No. 1, The American Physical Society, 1993, pp. 93-98.*
T.S. Boscke "Ferroelectricity in hafnium oxide thin fims", Applied Physics Letters, American Institute of Physics, vol. 99, 2011, pp. 102903-1 to 102903-3.*
X. Zhao et al., "First-principles study of structural, vibrational, and lattice dielectric properties of hafnium oxide", Physical Revew B, vol. 65, The American Physical Society, 2002, pp. 233106-1 to 133106-4.*
English Translation of the International Search Report issued Oct. 28, 2014 in PCT/JP2014/069368 filed Jul. 22, 2014.
T.S. Boescke, et al., "Ferroelectricity in hafnium oxide thin films", Applied Physics Letters, vol. 99, 2011, 4 Pages.
J. Mueller, et al., "Ferroelectric $Zr_{0.5}Hf_{0.5}O_2$ thin films for non-volatile memory applications", Applied Physics Letters, vol. 99, 2011, 4 Pages.
T.S. Boescke, et al., "Phase transitions in ferroelectric silicon doped hafnium oxide", Applied Physics Letters, vol. 99, 2011, 4 Pages.
U.S. Appl. No. 14/844,863, filed Sep. 3, 2015, Ino.

* cited by examiner

SEMICONDUCTOR DEVICE AND DIELECTRIC FILM INCLUDING A FLUORITE-TYPE CRYSTAL

CROSS-REFERENCE TO RELATED APPLICATION

This application is continuation application of, and claims the benefit of priority from the International Application PCT/JP2014/069368, filed Jul. 22, 2014, which claims the benefit of priority from Japanese Patent Application No. 2013-197703, filed on Sep. 25, 2013, the entire contents of all of which are incorporated herein by reference.

FIELD

Embodiments described herein relate generally to a semiconductor device and a dielectric film.

BACKGROUND

In a nonvolatile memory, it is becoming difficult to scale down a floating gate (FG) type flash memory or a metal/oxide/nitride/oxide/silicon (MONOS) type flash memory. Therefore, scaling-down using an operation principle different from these memories has been continuously looked for. Nonvolatile memories having various structures, such as a ferroelectric random access memory (FeRAM), a resistive random access memory (ReRAM), a phase change random access memory (PCRAM), a magnetic random access memory (MRAM), or a three-dimensional memory have been examined.

Among these memories, the FeRAM using a ferroelectric substance had the following problems. That is, the FeRAM included a material difficult to handle, such as lead, and reduction in thickness of the FeRAM was difficult due to a size effect. Therefore, it was difficult to put the FeRAM into practical use except the FeRAM for a limited purpose, such as radio frequency identification (RFID) cards including a small-scale FeRAM for low power consumption.

In such a deadlock, a hafnium oxide film has been reported as a ferroelectric film not containing lead, not difficult to make a thin film thereof, capable of low voltage operation, that is, low power consumption operation, and capable of holding a record for a long time. It is expected to realize the ferroelectric memories, such as FeRAM having a large capacity by using this hafnium oxide film.

DETAILED DESCRIPTION

Figure 1:
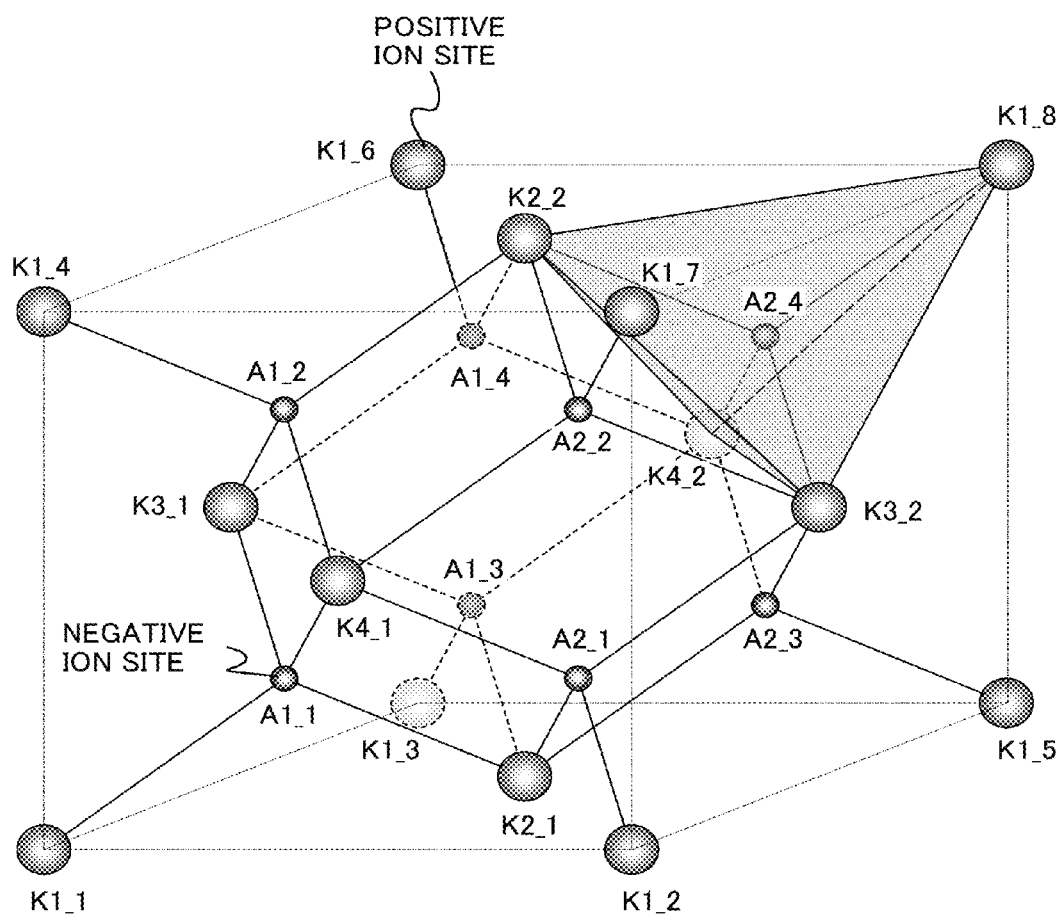
FIG. 1 is an explanatory view of an original unit cell.

A semiconductor device according to an embodiment includes a first conductive layer, a second conductive layer, and a dielectric film provided between the first conductive layer and the second conductive layer and including a fluorite-type crystal. A positive ion site of the fluorite-type crystal includes at least one of Hf (hafnium) and Zr (zirconium), and a negative ion site of the fluorite-type crystal includes O (oxygen). In the fluorite-type crystal, the following formulae (1) to (13) are satisfied, when, among the three axes of an original unit cell of the crystal, an axis in a direction with no reversal symmetry is c-axis, a stacking direction of atomic planes of two kinds formed by negative ions disposed at different positions is a-axis, the remainder is b-axis, the axis length of the a-axis of the original unit cell is a, the axis length of the b-axis thereof is b, and the axis length of the c-axis thereof is c, a parameter is p, and x, y, z, u, v and w are values represented using the parameter p.

$$x = 0.0000077293 \times p \times p - 0.00091484 \times p + 0.50556 \quad (1)$$

$$y = 0.0000089659 \times p \times p - 0.00082246 \times p + 0.52512 \quad (2)$$

$$z = -0.000012625 \times p \times p - 0.00045149 \times p + 0.50696 \quad (3)$$

$$u = -0.000042665 \times p \times p + 0.00097971 \times p + 1.0028 \quad (4)$$

$$v = -0.00032701 \times p + 0.96306 \quad (5)$$

$$w = -0.000042194 \times p \times p + 0.00068404 \times p + 0.96543 \quad (6)$$

$$-0.0074 \leq x - a \leq 0.026 \quad (7)$$

$$-0.0075 \leq y - b \leq 0.026 \quad (8)$$

$$-0.0056 \leq z - c \leq 0.006 \quad (9)$$

$$-0.063 \leq u - c + a \leq 0.0055 \quad (10)$$

$$-0.031 \leq v - a + b \leq 0.0024 \quad (11)$$

$$-0.077 \leq w - c + b \leq 0.006 \quad (12)$$

$$1 \leq p \leq 40 \quad (13)$$

FIG. 1 is an explanatory view of an original unit cell. Here, in the fluorite-type crystal structure, a structure in which the positive ion site and the negative ion site exist only at the following positions is defined as "original unit cell." The original unit cell defined here is referred to as basic unit cell in some documents. However, the term basic unit cell is mainly used for primitive unit cell. Therefore, the term original unit cell is defined here to avoid confusion.

As illustrated in FIG. 1, it is assumed that the fluorite original unit cell having such a structure as follows is selected. That is, in the fluorite original unit cell, as illustrated in FIG. 1, using rectangular coordinates or oblique coordinates in which the axis length of the unit cell is normalized, the positive ion site exists at a coordinate point represented by K1_1 (0,0,0), K1_2 (1+Δxk1_2, 0+Δyk1_2, 0+Δzk1_2), K1_3 (0+Δxk1_3, 1+Δyk1_3, 0+Δzk1_3), K1_4 (0+Δxk1_4, 0+Δyk1_4, 1+Δzk1_4), K1_5 (1+Δxk1_5, 1+Δyk1_5, 0+Δzk1_5), K1_6 (0+Δxk1_6, 1+Δyk1_6, 1+Δzk1_6), K1_7 (1+Δxk1_7, 0+Δyk1_7, 1+Δzk1_7), K1_8 (1+xk1_8, 1+Δyk1_8, 1+Δzk1_8), K2_1 (0.5+Δxk2_1, 0.5+Δyk2_1, 0+zk2_1), K2_2 (0.5+Δxk2_2, 0.5+yk2_2, 1+Δzk2_2), K3_1 (0+Δxk3_1, 0.5+Δyk3_1, 0.5+Δzk3_1), K3_2 (1+Δxk3_2, 0.5+Δyk3_2, 0.5+Δzk3_2), K4_1 (0.5+Δxk4_1, 0+Δyk4_1, 0.5+Δzk4_1), or K4_2 (0.5+Δxk4_2, 1+Δyk4_2, 0.5+Δzk4_2), and the negative ion site exists at a coordinate point represented by A1_1 (0.25+Δxa1_1, 0.25+Δya1_1, 0.25+Δza1_1), A1_2 (0.25+Δxa1_2, 0.25+Δya1_2, 0.75+Δza1_2), A1_3 (0.25+Δxa1_3, 0.75+Δya1_3, 0.25+Δza1_3), A1_4 (0.25+Δxa1_4, 0.75+Δya1_4, 0.75+Δza1_4), A2_1 (0.75+Δxa2_1, 0.25+ya2_1, 0.25+Δza2_1), A2_2 (0.75+Δxa2_2, 0.25+Δya2_2, 0.75+Δza2_2), A2_3 (0.75+Δxa2_3, 0.75+Δya2_3, 0.25+Δza2_3), or A2_4 (0.75+Δxa2_4, 0.75+Δya2_4, 0.75+Δza2_4).

Here, when p is any one of x, y, and z, q is k or a, r is any one of 1 to 4, and s is any one of 1 to 8, it is assumed that $-0.25 \leq \Delta pqr\_s \leq 0.25$ is satisfied. When the fluorite-type crystal structure does not have a superlattice structure, K1_1, K1_2, K1_3, K1_4, K1_5, K1_6, K1_7, and K1_8 are the same positive ion site, Δpqr_s (p is any one of x, y, and z, q is k, r is 1, and s is any one of 1 to 8) thereof is all 0, and one eighth of an atom is included in the unit cell at each site. Similarly, K2_1 and K2_2 are the same positive ion site, and one half of an atom is included in the unit cell at each site. Similarly, K3_1 and K3_2 are the same positive ion site, and one half of an atom is included in the unit cell at each site. Similarly, K4_1 and K4_2 are the same positive ion site, and one half of an atom is included in the unit cell at each site. Therefore, four atoms in total are included in the original unit cell. At the negative ion sites, eight atoms at A1_1, A1_2, A1_3, A1_4, A2_1, A2_2, A2_3, and A2_4 are included in the original unit cell.

Figure 2:
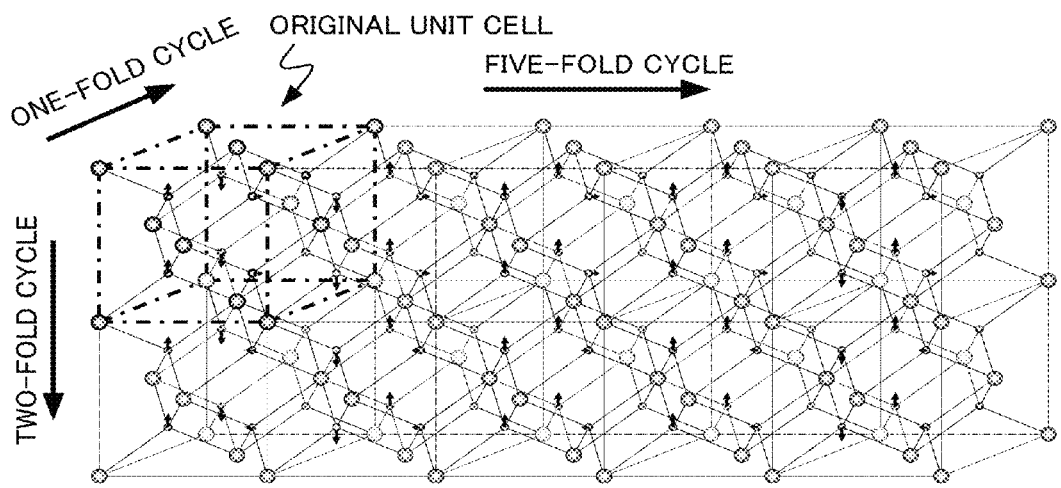
FIG. 2 is an explanatory view of a fluorite-type crystal having a superlattice structure.

FIG. 2 is an explanatory view of a fluorite-type crystal having a superlattice structure. Even when the fluorite-type crystal has a superlattice structure, the original unit cell is defined by the above-described definition.

When the fluorite-type crystal has a superlattice structure, the crystal structure includes original unit cells superposed at a fixed cycle. A positive ion or a negative ion existing in the original unit cell is modulated in a limited range of $-0.25 \leq \Delta pqr\_s \leq 0.25$ in each site. In FIG. 2, an arrow attached to the site indicates modulation. FIG. 2 illustrates the modulated original unit cell superposed at a five-fold cycle, a two-fold cycle, and one-fold cycle.

Here, a dividing signal is represented by "÷." However, "÷" can be replaced with "/."

Hereinafter, embodiments of the present disclosure will be described with reference to the drawings.

First Embodiment

A semiconductor device according to the present embodiment includes a first conductive layer, a second conductive layer, and a dielectric film provided between the first conductive layer and the second conductive layer. The dielectric film includes a fluorite-type crystal. A positive ion site of the fluorite-type crystal includes at least one of Hf (hafnium) and Zr (zirconium), and a negative ion site of the fluorite-type crystal includes O (oxygen). In the fluorite-type crystal, the following formulae (1) to (13) are satisfied, when, among the three axes of an original unit cell of the crystal, an axis in a direction with no reversal symmetry is c-axis, a stacking direction of atomic planes of two kinds formed by negative ions disposed at different positions is a-axis, the remainder is b-axis, the axis length of the a-axis of the original unit cell is a, the axis length of the b-axis thereof is b, and the axis length of the c-axis thereof is c, a parameter is p, and x, y, z, u, v and w are values represented using the parameter p.

$$x = 0.0000077293 \times p \times p - 0.00091484 \times p + 0.50556 \quad (1)$$

$$y = 0.0000089659 \times p \times p - 0.00082246 \times p + 0.52512 \quad (2)$$

$$z = -0.000012625 \times p \times p - 0.00045149 \times p + 0.50696 \quad (3)$$

$$u = -0.000042665 \times p \times p + 0.00097971 \times p + 1.0028 \quad (4)$$

$$v = -0.00032701 \times p + 0.96306 \quad (5)$$

$$w = -0.000042194 \times p \times p + 0.00068404 \times p + 0.96543 \quad (6)$$

$$-0.0074 \leq x - a \leq 0.026 \quad (7)$$

$$-0.0075 \leq y - b \leq 0.026 \quad (8)$$

$$-0.0056 \leq z - c \leq 0.006 \quad (9)$$

$$-0.063 \leq u - c + a \leq 0.0055 \quad (10)$$

$$-0.031 \leq v - a + b \leq 0.0024 \quad (11)$$

$$-0.077 \leq w - c + b \leq 0.006 \quad (12)$$

$$1 \leq p \leq 40 \quad (13)$$

Figure 3:
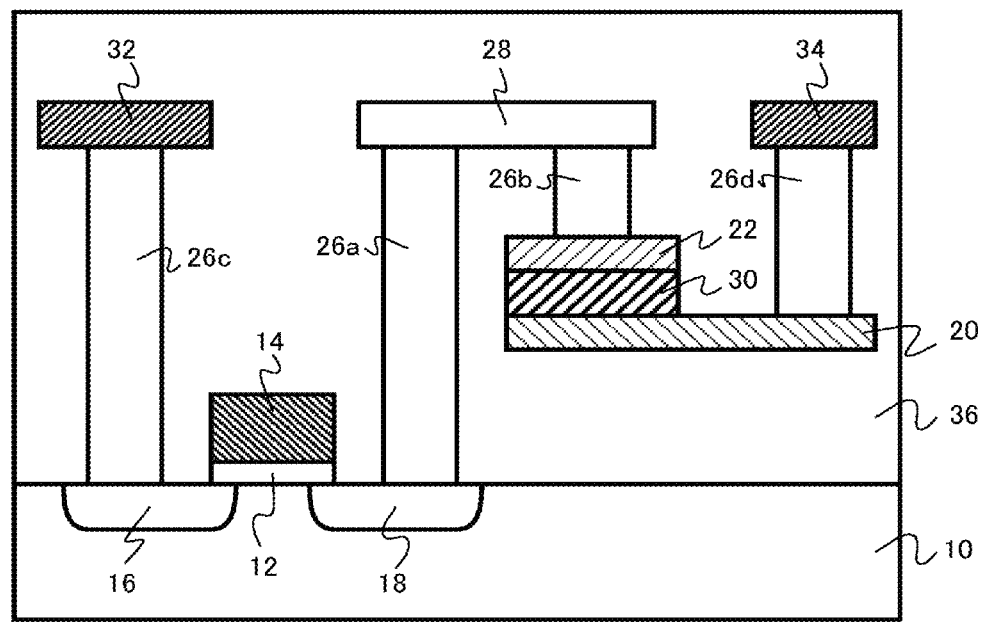
FIG. 3 is a schematic cross sectional view of a semiconductor device according to a first embodiment.

FIG. 3 is a schematic cross sectional view of the semiconductor device according to the present embodiment. The semiconductor device according to the present embodiment is a 1 transistor 1 capacitor type (1T1C type) FeRAM obtained by combining a capacitor using a ferroelectric substance as a dielectric film and a transistor for selecting a memory cell.

The semiconductor device according to the present embodiment includes a semiconductor substrate 10, a gate insulating film 12 formed on the semiconductor substrate 10, and a gate electrode 14 formed on the gate insulating film 12. A source impurity layer 16 and a drain impurity layer 18 are formed on a surface of the semiconductor substrate 10 on both sides of the gate electrode 14. The semiconductor substrate 10, the gate insulating film 12, the gate electrode 14, the source impurity layer 16, and the drain impurity layer 18 constitute the transistor for selecting a memory cell. The gate electrode 14 functions as a word line of the FeRAM.

The semiconductor substrate 10 is formed, for example, of single crystal silicon (Si). In addition to single crystal silicon (Si), single crystal germanium (Ge), single crystal silicon germanide (SiGe), single crystal indium phosphorus (InP), single crystal gallium arsenide (GaAs), or the like can be used.

The gate insulating film 12 is, for example, a silicon oxide film. The gate electrode 14 is formed, for example, of polycrystalline silicon doped with an impurity. The source impurity layer 16 and the drain impurity layer 18 are formed, for example, by diffusing arsenic (As) as an n-type impurity in the semiconductor substrate 10.

In addition, the semiconductor device according to the present embodiment includes a lower capacitor electrode (first conductive layer) 20 and an upper capacitor electrode (second conductive layer) 22. A dielectric film 30 is formed between the lower capacitor electrode 20 and the upper capacitor electrode 22. The lower capacitor electrode 20, the upper capacitor electrode 22, and the dielectric film 30 constitute a capacitor for storing memory data.

The lower capacitor electrode 20 and the upper capacitor electrode 22 are formed, for example, of conductive metal or a conductive metal compound. An example thereof is TiN (titanium nitride). TiN (titanium nitride) has a thickness, for example, of 1 nm or more and 10 nm or less.

The dielectric film 30 is an oxide including Hf (hafnium) and/or Zr (zirconium).

The drain impurity layer 18 and the upper capacitor electrode 22 are electrically connected to each other via a contact plug 26a, wiring 28, and a contact plug 26b. The contact plug 26a, the wiring 28, and the contact plug 26b are formed, for example, of conductive metal or a conductive metal compound.

The semiconductor device according to the present embodiment includes a bit line 32 and a plate line 34. The bit line 32 is electrically connected to the source impurity layer 16 via a contact plug 26c. The plate line 34 is connected to the lower capacitor electrode 20 via a contact plug 26d. The bit line 32, the plate line 34, the contact plug 26c, and the contact plug 26d are formed, for example, of conductive metal or a conductive metal compound.

An interlayer insulating film 36 is provided among the wiring, the electrodes, and the contact plugs. The interlayer insulating film 36 is, for example, a silicon oxide film.

At the time of writing, the FeRAM according to the present embodiment selects a memory cell with the word line and applies a voltage between the bit line 32 and the plate line 34 to thereby change a polarization direction of the dielectric film 30. At the time of reading, the FeRAM applies a pulse voltage and determines 1/0 by a fact that a current has flowed or not due to polarization reversal.

The dielectric film 30 according to the present embodiment includes a fluorite-type crystal. In the fluorite-type crystal, the following formulae (1) to (13) are satisfied, when, among the three axes of an original unit cell of the crystal, an axis in a direction with no reversal symmetry is c-axis, a stacking direction of atomic planes of two kinds formed by negative ions disposed at different positions is a-axis, the remainder is b-axis, the axis length of the a-axis of the original unit cell is a, the axis length of the b-axis thereof is b, and the axis length of the c-axis thereof is c, a parameter is p, and x, y, z, u, v and w are values represented using the parameter p. The positive ion site in the fluorite-type crystal includes Hf (hafnium) and/or Zr (zirconium), and the negative ion site in the fluorite-type crystal includes O (oxygen).

$$x = 0.0000077293 \times p \times p - 0.00091484 \times p + 0.50556 \quad (1)$$

$$y = 0.0000089659 \times p \times p - 0.00082246 \times p + 0.52512 \quad (2)$$

$$z = -0.000012625 \times p \times p - 0.00045149 \times p + 0.50696 \quad (3)$$

$$u = -0.000042665 \times p \times p + 0.00097971 \times p + 1.0028 \quad (4)$$

$$v = -0.00032701 \times p + 0.96306 \quad (5)$$

$$w = -0.000042194 \times p \times p + 0.00068404 \times p + 0.96543 \quad (6)$$

$$-0.0074 \leq x - a \leq 0.026 \quad (7)$$

$$-0.0075 \leq y - b \leq 0.026 \quad (8)$$

$$-0.0056 \leq z - c \leq 0.006 \quad (9)$$

$$-0.063 \leq u - c + a \leq 0.0055 \quad (10)$$

$$-0.031 \leq v - a + b \leq 0.0024 \quad (11)$$

$$-0.077 \leq w - c + b \leq 0.006 \quad (12)$$

$$1 \leq p \leq 40 \quad (13)$$

Figure 4A:
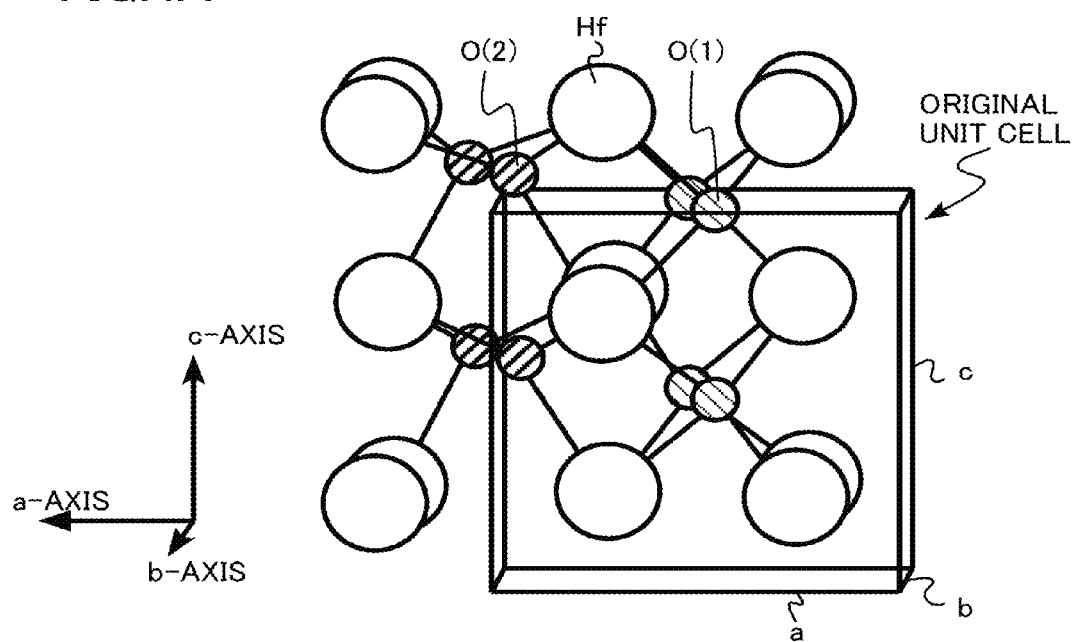
FIGS. 4A and 4B are explanatory views of a crystal structure of hafnium oxide.
Figure 4B:
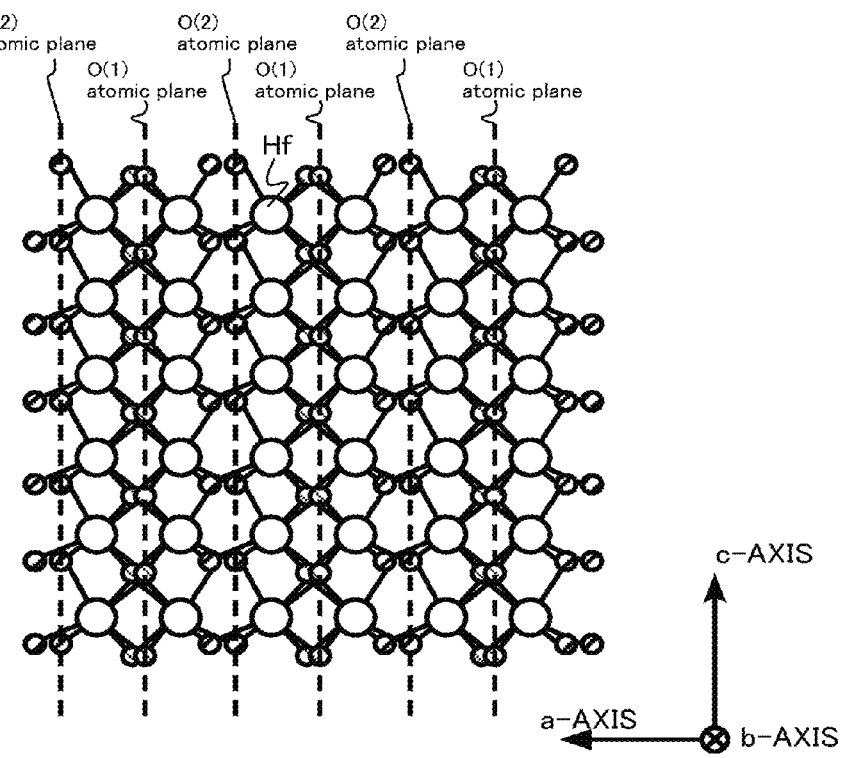

Hereinafter, as the dielectric film 30, hafnium oxide including Hf (hafnium) at the positive ion site will be exemplified. FIGS. 4A and 4B are explanatory views of a crystal structure of hafnium oxide as the dielectric film. FIG. 4A is an explanatory view of an original unit cell. FIG. 4B is an explanatory view of a relation between a crystal structure and an axial direction.

The crystal of hafnium oxide included in the dielectric film 30 according to the present embodiment includes a crystal structure of a space group $Pbc2_1$ (space group number 29). This crystal structure is a third orthorhombic crystal (orthorhombic III). The crystal of hafnium oxide includes a fluorite-type crystal structure or a crystal structure in which the fluorite-type crystal structure is deformed into martensite.

As illustrated in FIG. 4A, in the original unit cell of the third orthorhombic crystal, only one site (positive ion site) of an Hf (hafnium) atom exists, but two sites (negative ion sites) of an O (oxygen) atom exist. In other words, O (oxygen) atoms (negative ions) disposed at different positions exist.

Each site of the O atom is referred to as O(1) or O(2), as illustrated in FIG. 4A. An O atom existing in the O(2) site of the O atoms existing in the above-described two sites does not have reversal symmetry, and is considered to contribute to ferroelectricity.

As illustrated in FIG. 4B, an O atom (negative ion) in the O(1) site forms an O(1) atomic plane, and an O atom (negative ion) in the O(2) site forms an O(2) atomic plane. In this way, the crystal of hafnium oxide includes two kinds of atomic planes formed by the negative ions disposed at different positions. These two kinds of atomic planes form a stacking structure.

In the present embodiment, among the three axes of the original unit cell, an axis in a direction with no reversal symmetry is c-axis. A stacking direction of atomic planes of two kinds formed by negative ions disposed at different positions is a-axis. The remainder is b-axis. A relation between the crystal structure and each of the a-axis, the b-axis, and the c-axis is illustrated in FIG. 4B.

In the present embodiment, the axis length of the a-axis of the original unit cell is a, the axis length of the b-axis thereof is b, and the axis length of the c-axis thereof is c. FIG. 4A illustrates a relation between a shape of the original unit cell and each of the axis lengths a, b, and c. In the present embodiment, in hafnium oxide including the crystal structure of the space group $Pbc2_1$ (space group number 29), the axis lengths a, b, and c are defined as described above.

In hafnium oxide in the dielectric film 30 according to the present embodiment, the axis length of the a-axis of the original unit cell is a, the axis length of the b-axis thereof is b, and the axis length of the c-axis thereof is c. A parameter is p, and x, y, z, u, v and w are values represented using the parameter p. In this case, the following formulae (1) to (13) are satisfied.

$$x = 0.0000077293 \times p \times p - 0.00091484 \times p + 0.50556 \quad (1)$$

$$y = 0.0000089659 \times p \times p - 0.00082246 \times p + 0.52512 \quad (2)$$

$$z=-0.000012625 \times p \times p-0.00045149 \times p+0.50696 \quad (3)$$

$$u=-0.000042665 \times p \times p+0.00097971 \times p+1.0028 \quad (4)$$

$$v=-0.00032701 \times p+0.96306 \quad (5)$$

$$w=-0.000042194 \times p \times p+0.00068404 \times p+0.96543 \quad (6)$$

$$-0.0074 \le x-a \le 0.026 \quad (7)$$

$$-0.0075 \le y-b \le 0.026 \quad (8)$$

$$-0.0056 \le z-c \le 0.006 \quad (9)$$

$$-0.063 \le u-c+a \le 0.0055 \quad (10)$$

$$-0.031 \le v-a+b \le 0.0024 \quad (11)$$

$$-0.077 \le w-c+b \le 0.006 \quad (12)$$

$$1 \le p \le 40 \quad (13)$$

By analyzing the dielectric film 30 with an X-ray diffraction method, it can be determined whether the above-described formulae (1) to (13) are satisfied.

The present inventors have focused on the crystal structures of hafnium oxide and zirconium oxide, and have found a crystal structure in which hafnium oxide and zirconium oxide exhibit high ferroelectricity with first principle calculation. It has been clarified that the crystal structure described above has large spontaneous polarization and exhibits high ferroelectricity stably.

Projector augmented wave method (PAW method) using a plane-wave basis was used for the first principle calculation. A cut-off energy of a wave function was assumed to be 25 Rydberg. A cut-off energy of a charge density distribution was assumed to be 225 Rydberg. For a K point sampling mesh, 4×4×4 was selected. A unit cell was assumed to have a size including 12 atoms.

By comparing with a calculation with different cut-off energies and mesh sizes or a calculation by an ultrasoft pseudopotential method, it was confirmed that sufficient convergence and calculation accuracy were obtained. In addition, a calculation was performed while it was assumed that a stress caused by a process or a structure was applied. When the stress or the like was changed, a recalculation was performed for lattice relaxation.

As a result of the first principle calculation, it was found out that the crystal structure needed to satisfy the above-described conditions to obtain high ferroelectricity.

As a result of the first principle calculation, it was revealed that the third orthorhombic crystal was unstable when the stress applied to hafnium oxide or zirconium oxide was small, and that a monoclinic crystal was stable at normal pressure or atmospheric pressure. Therefore, it is estimated that ferroelectricity is not easily exhibited at normal pressure or atmospheric pressure.

It was revealed that the third orthorhombic crystal was particularly stable under a fixed stress. That is, the third orthorhombic crystal is particularly stable under a stress of 1 GPa or more and 40 GPa or less, and exhibits high ferroelectricity.

Ferroelectric polarization in the present calculation was calculated using Born effective charges by Berry phase. The dielectric film 30 according to the present embodiment obtained a spontaneous polarization value, for example, typically of 0.5983 C/m² in the c-axis direction. The calculated Born effective charges are indicated below.

$$Z^*_{Hf} = \begin{pmatrix} 5.71595 & -0.49866 & 0.15711 \\ 0.00478 & 5.62860 & 0.08975 \\ 0.26057 & -0.06130 & 4.86088 \end{pmatrix}$$

$$Z^*_{O1} = \begin{pmatrix} -3.13172 & 0.93060 & 0.59080 \\ 1.13076 & -2.64195 & 0.30973 \\ 0.52084 & 0.27781 & -2.33727 \end{pmatrix}$$

$$Z^*_{O2} = \begin{pmatrix} -2.58422 & 0.06577 & 0.02636 \\ 0.11511 & -2.98665 & -0.41107 \\ -0.02533 & -0.47332 & -2.52361 \end{pmatrix}$$

The dielectric film 30 according to the present embodiment has large and stable spontaneous polarization, and therefore has stable and high ferroelectricity. Therefore, even if the dielectric film 30 has a small thickness of 10 nm or less, ferroelectricity does not attenuate or disappear. Therefore, the semiconductor device according to the present embodiment obtains a sufficient storage signal even if scaled-down. This makes it easy to scale-down the semiconductor device.

When the atomic concentration of Hf (hafnium) and the atomic concentration of O (oxygen) in the dielectric film are q and r, respectively, the following relation is preferably satisfied. Larger spontaneous polarization is obtained by satisfying the following relation. Therefore, the dielectric film having more stable and higher ferroelectricity is realized.

$$1.95 \le r \div q \le 1.99$$

When the dielectric film includes at least one element selected froma group consisting of Zr (zirconium), Si (silicon), Y (yttrium), Al (aluminum), Sr (strontium), La (lanthanum), Ce (cerium), Pr (praseodymium), Nd (neodymium), Sm (samarium), Eu (europium), Gd (gadolinium), Tb (terbium), Dy (dysprosium), Ho (holmium), Er (erbium), Tm (thulium), Yb (ytterbium), Lu (lutetium), F (fluorine), Cl (chlorine), and N (nitrogen), a total atomic concentration of the above elements in the dielectric film is s, and the atomic concentration of Hf is q, the following relation is preferably satisfied. Larger spontaneous polarization is obtained by satisfying the following relation. Therefore, the dielectric film having more stable and higher ferroelectricity is realized.

$$0.01 \le s \div (q+s) \le 0.2$$

When the dielectric film includes Hf (hafnium) and Zr (zirconium), and the atomic concentration of Hf (hafnium) and an atomic concentration of Zr are q and t, respectively, the following relation is preferably satisfied. Larger spontaneous polarization is obtained by satisfying the following relation. Therefore, the dielectric film having more stable and higher ferroelectricity is realized.

$$0.4 \le q \div (q+t) \le 0.6$$

When the dielectric film includes Zr (zirconium), and the atomic concentration of Zr and the atomic concentration of O (oxygen) are t and r, respectively, the following relation is preferably satisfied. Larger spontaneous polarization is obtained by satisfying the following relation. Therefore, the dielectric film having more stable and higher ferroelectricity is realized.

$$1.95 \le r \div t \le 2, 4 \le p \le 40$$

The atomic concentration of each atom in the dielectric film can be analyzed, for example, by a secondary ionmicroprobe mass spectrometry (SIMS) method, an Auger electron spectroscopy (AES) method, an X-ray photoelectron spectroscopy (XPS) method, or a high resolution-Rutherford back scattering (HR-RBS) method.

The maximum range of protrusions and recesses on an interface between the first conductive layer 20 and the dielectric film 30 or the maximum range of protrusions and recesses on an interface between the second conductive layer 22 and the dielectric film 30 is preferably 0.15 nm or more and 1.0 nm or less. This make it easy to form the dielectric film satisfying the above-described formulae (1) to (13). The maximum range of protrusions and recesses is defined by a difference between a maximum value and a minimum value of the protrusions and recesses in a thickness direction of the conductive layer. The maximum range of protrusions and recesses can be obtained by observing a cross section of the semiconductor device with transmission electron microscope (TEM).

When the maximum range of protrusions and recesses is out of the above-described range, an appropriate stress is not applied to the dielectric film 30, and it is difficult to obtain the dielectric film having high ferroelectricity. Both the maximum range of protrusions and recesses on the interface between the first conductive layer 20 and the dielectric film 30 and the maximum range of protrusions and recesses on the interface between the second conductive layer 22 and the dielectric film 30 are preferably 0.15 nm or more and 1.0 nm or less.

A deviation amount of an O (oxygen) atom existing in the O(2) site in the crystal structure from the center of the Hf tetrahedron is preferably 0.02 nm or more. By the deviation amount of 0.02 nm or more, large spontaneous polarization is obtained, and the dielectric film 30 having high ferroelectricity is realized.

In hafnium oxide in the dielectric film 30, the axis length of the a-axis of the original unit cell is a, the axis length of the b-axis thereof is b, the axis length of the c-axis thereof is c, a parameter is p, and x, y, z, u, v and w are values represented using the parameter p. In this case, the following formulae (7') to (13') are preferably satisfied in place of the above-described formulae (7) to (13). Larger spontaneous polarization is obtained by satisfying the following formulae (7') to (13'). The dielectric film having higher ferroelectricity is realized.

$$-0.0074 \leq x-a \leq 0.0037 \tag{7'}$$

$$-0.0057 \leq y-b \leq 0.0089 \tag{8'}$$

$$-0.0056 \leq z-c \leq 0.0015 \tag{9'}$$

$$-0.0043 \leq u-c+a \leq 0.0055 \tag{10'}$$

$$-0.031 \leq v-a+b \leq 0.0024 \tag{11'}$$

$$-0.028 \leq w-c+b \leq 0.003 \tag{12'}$$

$$1 \leq p \leq 30 \tag{13'}$$

Next, methods for manufacturing the dielectric film and the semiconductor device according to the present embodiment will be described with reference to FIG. 3.

First, the semiconductor substrate 10 is prepared. The semiconductor substrate 10 is formed, for example, of silicon (Si).

Subsequently, the gate insulating film 12 and the gate electrode 14 are formed on the semiconductor substrate 10 using a well-known manufacturing method. The gate insulating film 12 is, for example, a silicon oxide film. The gate electrode 14 is formed, for example, of polycrystalline silicon doped with an impurity.

The source impurity layer 16 and the drain impurity layer 18 are formed on a surface of the semiconductor substrate 10 on both sides of the gate electrode 14 using a well-known manufacturing method. The source impurity layer 16 and the drain impurity layer 18 are formed, for example, by ion implantation of arsenic (As) as an n-type impurity in the semiconductor substrate 10.

Subsequently, an interlayer insulating film is formed on the gate electrode 14 using a well-known manufacturing method. The interlayer insulating film is, for example, a silicon oxide film.

Subsequently, the lower capacitor electrode (first conductive layer) 20 is formed on the interlayer insulating film. As the lower capacitor electrode (first conductive layer) 20, for example, TiN (titanium nitride) is deposited.

A method for depositing the lower capacitor electrode (first conductive layer) 20 may be a vapor phase film deposition method such as chemical vapor deposition (CVD) or atomic layer deposition (ALD), or a physical film deposition method such as sputtering.

The maximum range of protrusions and recesses on a surface of the lower capacitor electrode (first conductive layer) 20 is preferably 0.15 nm or more and 1.0 nm or less. By having the maximum range of protrusions and recesses within the above-described range, surface enthalpy can be kept to be a suitable value. The ferroelectricity of the dielectric film 30 formed on the surface of the lower capacitor electrode (first conductive layer) 20 is high.

When the maximum range of protrusions and recesses is lower than the above-described range, the surface enthalpy is decreased. Therefore, an appropriate stress is not applied to the dielectric film 30, the monoclinic crystal is more stable than the third orthorhombic crystal, and it is difficult to obtain the dielectric film having high ferroelectricity. When the maximum range of protrusions and recesses is higher than the above-described range, the surface enthalpy is increased. An amorphous structure is thereby more stable than the third orthorhombic crystal, and it is difficult to obtain the dielectric film having high ferroelectricity.

When a film serving as the lower capacitor electrode (first conductive layer) 20 is deposited by the vapor phase film deposition method, a heat treatment may be performed after film deposition to remove an impurity in the film. The maximum range of protrusions and recesses after this heat treatment is preferably within the above-described range. For example, it is not desired that a particle diameter of the crystal included in the dielectric film becomes large due to the heat treatment and that the maximum range of protrusions and recesses exceeds the above-described range.

Subsequently, the lower capacitor electrode (first conductive layer) 20 is patterned. The dielectric film 30 including Hf (hafnium) and/or Zr (zirconium) is deposited on the lower capacitor electrode (first conductive layer) 20. A method for depositing the dielectric film 30 may be a vapor phase film deposition method such as chemical vapor deposition (CVD) or atomic layer deposition (ALD), or a physical film deposition method such as sputtering.

The maximum range of protrusions and recesses on a surface of the dielectric film 30 is preferably 0.15 nm or more and 1.0 nm or less. By having the maximum range of protrusions and recesses within the above-described range, the surface enthalpy can be kept to be a suitable value. The ferroelectricity of the dielectric film 30 is high.

As described above, when the maximum range of protrusions and recesses is lower than the above-described range, the surface enthalpy is decreased. Therefore, an appropriate stress is not applied to the dielectric film 30, the monoclinic crystal is more stable than the third orthorhombic crystal, and it is difficult to obtain the dielectric film having high ferroelectricity. When the maximum range of protrusions and recesses is higher than the above-described range, the surface enthalpy is increased. An amorphous structure is thereby more stable than the third orthorhombic crystal, and it is difficult to obtain the dielectric film having high ferroelectricity.

When the dielectric film 30 is formed of hafnium oxide, the dielectric film 30 after film deposition is, for example, amorphous. A Hf atom is tetravalent, and a closest atom to the Hf atom is an O atom. Seven O atoms are coordinated to the Hf atom, and three and half Hf atoms are coordinated to the O atom.

When the dielectric film 30 is formed of hafnium oxide, a depositing method so as to reduce the atomic concentration of oxygen in the dielectric film 30 is preferably used from a viewpoint of obtaining high ferroelectricity. That is, when an atomic concentration of Hf (hafnium) and an atomic concentration of O (oxygen) in the dielectric film are q and r, respectively, it is desired to perform deposition under such a condition as $1.95 \leq r \div q \leq 1.99$. For example, in the sputtering, by reducing a partial pressure of oxygen in sputtering gas, the atomic concentration of oxygen in the dielectric film 30 is reduced.

Immediately after the dielectric film 30 is deposited, for example, for removing the impurity, the dielectric film 30 may be subjected to a heat treatment, for example, at 500° C. or lower and for 30 seconds or less. If the heat treatment within the above-described range is performed, change in the structure of the dielectric film 30 can be suppressed.

Subsequently, the upper capacitor electrode (second conductive layer) 22 is formed on the dielectric film 30. As the upper capacitor electrode (second conductive layer) 22, for example, TiN (titanium nitride) is deposited. The upper capacitor electrode (second conductive layer) 22 functions also as a diffusion preventing film preventing an impurity such as oxygen from entering the dielectric film 30 from external atmosphere by diffusion.

A method for depositing the upper capacitor electrode (second conductive layer) 22 may be a vapor phase film deposition method such as chemical vapor deposition (CVD) or atomic layer deposition (ALD), or a physical film deposition method such as sputtering.

The upper capacitor electrode (second conductive layer) 22 is preferably amorphous during film deposition. A condition for film deposition is preferably 500° C. or less. When the film deposition temperature is high, the structure of the dielectric film 30 changes, and it is difficult to manufacture a film having high ferroelectricity finally.

When the dielectric film 30 is formed such that the maximum range of protrusions and recesses on the surface of the dielectric film 30 is 0.15 nm or more and 1.0 nm or less, a film serving as the upper capacitor electrode (second conductive layer) 22 is preferably deposited while keeping this maximum range of protrusions and recesses. By keeping the maximum range of protrusions and recesses within the above-described range, the surface enthalpy can be kept to be a suitable value. The ferroelectricity of the dielectric film 30 is high.

As described above, when the maximum range of protrusions and recesses is lower than the above-described range, the surface enthalpy is decreased. Therefore, an appropriate stress is not applied to the dielectric film 30, the monoclinic crystal is more stable than the third orthorhombic crystal, and it is difficult to obtain the dielectric film having high ferroelectricity. When the maximum range of protrusions and recesses is higher than the above-described range, the surface enthalpy is increased. An amorphous structure is thereby more stable than the third orthorhombic crystal, and it is difficult to obtain the dielectric film having high ferroelectricity.

After the upper capacitor electrode (second conductive layer) 22 is formed, a heat treatment (annealing) is performed to crystallize the dielectric film 30. The temperature of the heat treatment is preferably 500° C. or higher and 600° C. or lower. When the temperature is lower than the above-described range, it is difficult to crystallize the dielectric film 30 to obtain the crystal structure of the space group Pbc2$_1$ (space group number 29). When the temperature is higher than the above-described range, other metal materials or the like included in the semiconductor device may be broken.

The time for the heat treatment is preferably 5 seconds or more and 60 seconds or less. When the time is less than the above-described range, the dielectric film 30 may not be able to be crystallized sufficiently. When the time is more than the above-described range, the upper capacitor electrode (second conductive layer) 22 may not be able to suppress the diffusion of the impurity from external atmosphere sufficiently. In addition, the lower capacitor electrode (first conductive layer) 20 and the upper capacitor electrode (second conductive layer) 22 may react with the dielectric film 30.

If other materials included in the semiconductor device have sufficient heat resistance, the heat treatment can be performed at a temperature of 500° C. or higher and 600° C. or lower. When the heat treatment is performed at a temperature of 850° C. or higher, the time at 850° C. or higher is preferably 10 milliseconds or less. When the heat treatment is performed at a temperature of 850° C. or higher, a temperature change at the time of temperature rise from 800° C. to a predetermined temperature and a temperature change at the time of temperature fall to 800° C. are preferably $2 \times 10^{5}$ ° C./s or more. By such a rapid heat treatment, a predetermined crystallization temperature can be reached without obtaining a crystal structure stable at a low temperature having low ferroelectricity. The dielectric film 30 has lower fluidity and is fixed while a stress is applied to the dielectric film 30 from the surroundings. A crystal structure having high ferroelectricity is thereby easily realized. Such a rapid heat treatment is realized, for example, by flash lamp annealing.

Thereafter, the dielectric film 30 and the upper capacitor electrode (second conductive layer) 22 are patterned using a well-known manufacturing method. Thereafter, the interlayer insulating film, the contact plugs 26a to 26d, the wiring 28, the bit line 32, and the plate line 34 are formed using a well-known manufacturing method. The semiconductor device illustrated in FIG. 3 is manufactured by the manufacturing method described above.

In order to apply a stress to the dielectric film 30, a film formed of a material having a thermal expansion coefficient different from the dielectric film 30 may be formed on a side surface of the dielectric film 30 to be subjected to a heat treatment. Examples of the material having a thermal expansion coefficient different from the dielectric film 30 include an amorphous silicon oxide film, a silicon nitride film, an aluminum nitride film, and an aluminum oxide film. The heat treatment is performed at 600° C. or higher and 800° C. or lower for 10 seconds or more and 30 seconds or less.

As described above, according to the present embodiment, a dielectric film which can hold ferroelectricity even if reduced in thickness is realized. In addition, according to the present embodiment, a semiconductor device including a dielectric film which can hold ferroelectricity even if reduced in thickness is realized. Therefore, a semiconductor device suitable for scaling-down is realized.

Second Embodiment

A semiconductor device according to the present embodiment is similar to that in the first embodiment except that the semiconductor device according to the present embodiment is a 1 transistor type (1T type) FeRAM. A structure of a dielectric film is similar to that in the first embodiment. Therefore, some contents overlapping with the first embodiment are not described.

Figure 5:
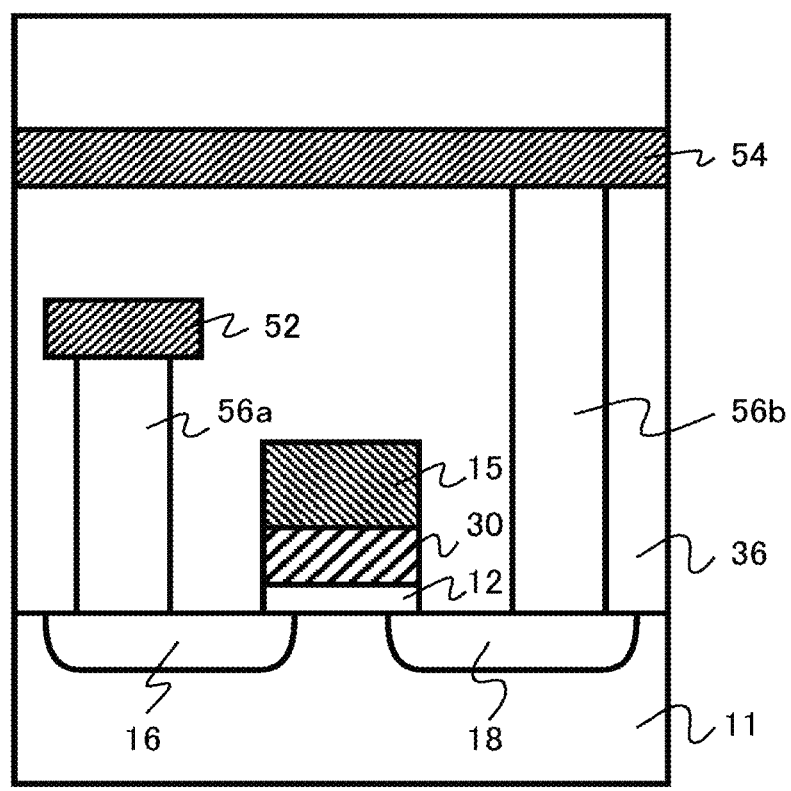
FIG. 5 is a schematic cross sectional view of a semiconductor device according to a second embodiment.

FIG. 5 is a schematic cross sectional view of the semiconductor device according to the present embodiment. The semiconductor device according to the present embodiment is the 1 transistor type (1T type) FeRAM including a capacitor of a ferroelectric substance. This type of memory is also described as FeFET (Ferroelectric FET) memory.

The semiconductor device according to the present embodiment includes a semiconductor substrate (first conductive layer) 11, a gate insulating film 12 formed on the semiconductor substrate 11, a dielectric film 30 formed on the gate insulating film 12, and a gate electrode (second conductive layer) 15 formed on the dielectric film 30.

The gate insulating film 12 is not necessarily required in the present embodiment. A driving force of a transistor can be enhanced by not including the gate insulating film 12. Therefore, this is advantageous for scaling-down. This structure is possible just because a ferroelectric substance containing $HfO_2$ mainly or at about a half content in the dielectric film 30 is used in the present embodiment.

Even if an insulating film is formed by oxidation of the semiconductor substrate 11 as a base when the dielectric film 30 is manufactured, there is no trouble for operating the semiconductor device according to the present embodiment. A source impurity layer (source region) 16 and a drain impurity layer (drain region) 18 are formed at a surface of the semiconductor substrate 11 on both sides of the gate electrode 15.

The semiconductor substrate (first conductive layer) 11, the gate insulating film 12, the dielectric film 30, the gate electrode (second conductive layer) 15, the source impurity layer 16, and the drain impurity layer 18 constitute a transistor for selecting a memory cell. The semiconductor substrate (first conductive layer) 11, the gate insulating film 12, the dielectric film 30, and the gate electrode (second conductive layer) 15 constitute a capacitor for storing memory data. The gate electrode 15 functions as a word line of the FeFET.

The semiconductor substrate 11 is formed, for example, of silicon (Si). The gate insulating film 12 is, for example, a silicon oxide film. The gate electrode 15 is formed, for example, of conductive metal or a conductive metal compound. An example thereof is TiN (titanium nitride). The source impurity layer 16 and the drain impurity layer 18 are formed, for example, by diffusing arsenic (As) as an n-type impurity in the semiconductor substrate 11.

The dielectric film 30 is an oxide including Hf (hafnium) and/or Zr (zirconium). The dielectric film 30 is a ferroelectric film including a crystal structure similar to that of the first embodiment.

The semiconductor device according to the present embodiment includes a first bit line 52 and a second bit line 54. The first bit line 52 is electrically connected to the source impurity layer 16 via a contact plug 56a. The second bit line 54 is connected to the drain impurity layer 18 via a contact plug 56b. The first bit line 52, the second bit line 54, the contact plug 56a, and the contact plug 56b are formed, for example, of conductive metal or a conductive metal compound.

An interlayer insulating film 36 is provided among the wiring, the electrodes, and the contact plugs. The interlayer insulating film 36 is, for example, a silicon oxide film.

At the time of writing (programming), the FeFET according to the present embodiment selects a memory cell with the word line 15 and applies a voltage between the word line 15 and the first and second bit lines 52, 54 to thereby change a polarization direction of the dielectric film 30. The word line 15 may be positively biased and the first bit line 52 and the second bit line 54 may be fixed to ground potential. At the time of erasing, a voltage is applied between the word line 15 and the semiconductor substrate 11, thereby change a polarization direction of the dielectric film 30. The word line 15 may be fixed to ground potential and the semiconductor substrate 11 may be positively biased. The first bit line 52 and the second bit line 54 may be kept floating. At the time of reading, the FeFET determines 1/0 with a current value flowing between the first bit line 52 and the second bit line 54.

According to the present embodiment, a semiconductor device including a dielectric film which can hold ferroelectricity even if reduced in thickness is realized. Therefore, a semiconductor device suitable for scaling-down is realized.

Third Embodiment

A semiconductor device according to the present embodiment is different from that in the first or second embodiment in that the semiconductor device according to the present embodiment is a nonvolatile semiconductor device having a three-dimensional structure using a so-called bit-cost scalable (BiCS) technology. A dielectric film itself is similar to that in the first embodiment. Therefore, some contents overlapping with the first or second embodiment are not described.

Figure 6:
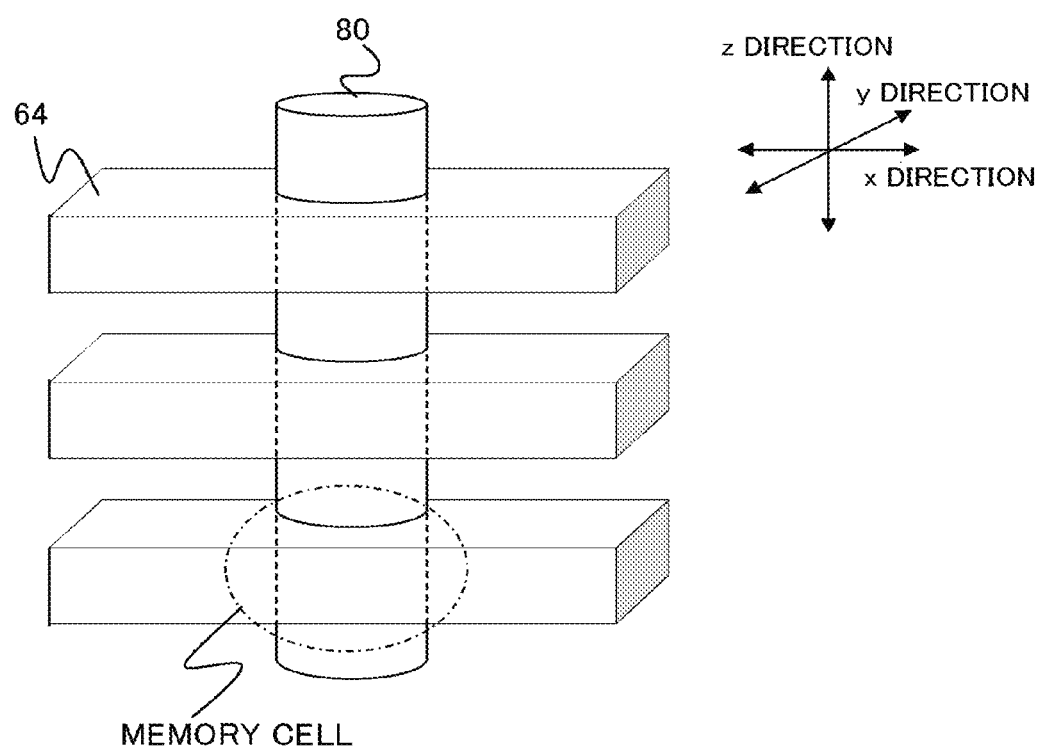
FIG. 6 is a three-dimensional conceptual diagram of a semiconductor device according to a third embodiment.
Figure 7:
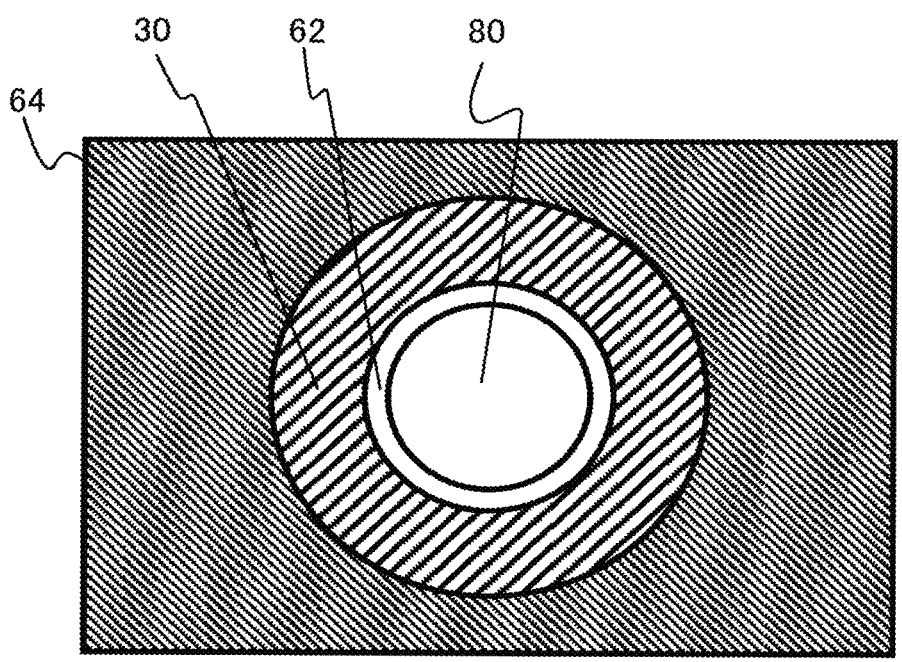
FIG. 7 is an XY schematic cross sectional view of FIG. 6.
Figure 7:
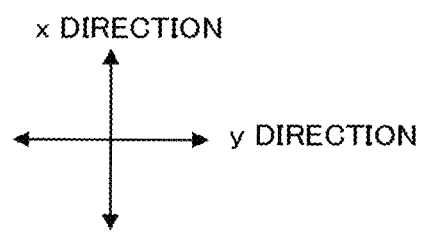
Figure 8:
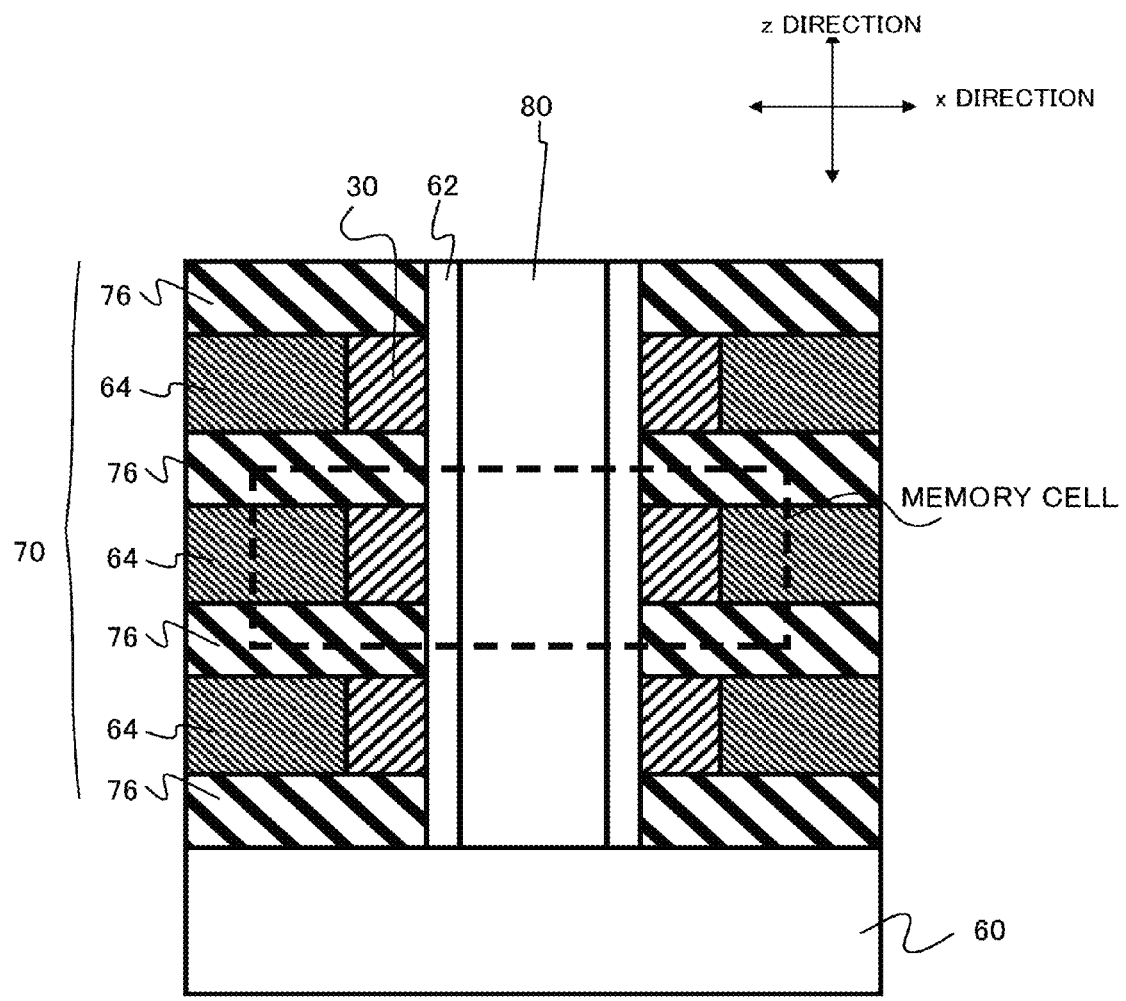
FIG. 8 is an XZ schematic cross sectional view of FIG. 6.

FIG. 6 is a three-dimensional conceptual diagram of the semiconductor device according to the present embodiment. FIG. 7 is an XY schematic cross sectional view of FIG. 6. FIG. 8 is an XZ schematic cross sectional view of FIG. 7.

The semiconductor device according to the present embodiment, for example, includes a stacked body 70 having an insulating layer 76 and a control gate electrode layer 64 stacked plurally and alternately on a silicon substrate 60. The insulating layer 76 is, for example, a silicon oxide film. The control gate electrode layer (second conductive layer) 64 is formed, for example, of polycrystalline silicon doped with an impurity and provided with conductivity.

A hole penetrating from the upper surface of the stacked body 70 to the control gate electrode layer 64 as the lowest layer is provided. A dielectric film 30 is provided on a side surface of the control gate electrode layer 64 in the hole.

The dielectric film 30 is an oxide including Hf (hafnium) and/or Zr (zirconium). The dielectric film 30 is a ferroelectric film including a crystal structure similar to that of the first embodiment.

Furthermore, a gate insulating film 62 is provided on an inner surface of the dielectric film 30. The gate insulating film 62 is, for example, a silicon oxide film. The gate insulating film 62 is not necessarily required in the present embodiment.

A pillar-shaped semiconductor layer (first conductive layer) 80 is formed on an inner surface of the gate insulating film 62. The semiconductor layer 80 is formed, for example, of silicon.

In FIGS. 6 and 8, an area surrounded by a broken line is one memory cell. In a structure of the memory cell, the gate insulating film 62 is formed on the semiconductor layer (first conductive layer) 80, the dielectric film 30 is formed on the gate insulating film 62, and the control gate electrode layer 64 is formed on the dielectric film 30. This memory cell is a cell of the 1 transistor type FeFET, and these cells are longitudinally connected in series.

According to the present embodiment, a semiconductor device including a dielectric film which can hold ferroelectricity even if reduced in thickness is realized. Therefore, a semiconductor device suitable for scaling-down is realized.

In addition, according to the present embodiment, an integration degree of the memory cell is enhanced by making the memory cell three-dimensional, and it is possible to realize the semiconductor device having a higher integration degree than that in the first or second embodiment. And furthermore, this type of memory cell arrangement is useful not only for three-dimensional NAND type but also for conventional two-dimensional arrangement of NAND type at comparatively small sized memory system.

Figure 9:
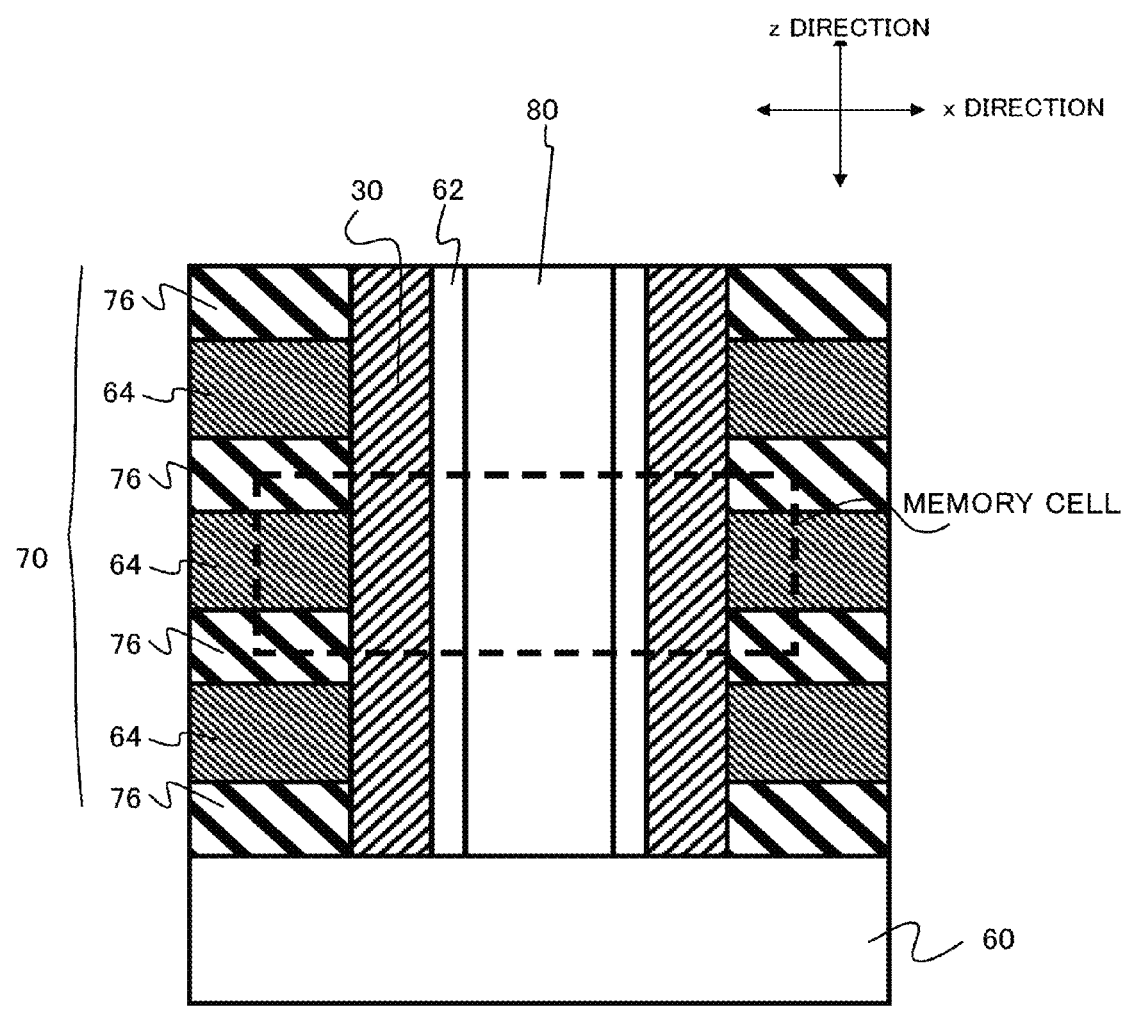
FIG. 9 is a schematic cross sectional view of a semiconductor device according to a modification example of the third embodiment.

FIG. 9 is a schematic cross sectional view of a semiconductor device according to a modification example of the present embodiment. The semiconductor device according to the modification example is similar to that in the above-described embodiment except that the dielectric film 30 is not divided for each memory cell and continuous in the semiconductor device according to the modification example. Also in this modification example, it is possible to obtain similar effects to those in the above-described embodiment.

Fourth Embodiment

A semiconductor device according to the present embodiment is different from that in the first embodiment in that the semiconductor device according to the present embodiment is a nonvolatile semiconductor device using ferroelectric tunnel junction (FTJ) with a thin ferroelectric film. A dielectric film itself is similar to that in the first embodiment. Therefore, some contents overlapping with the first embodiment are not described.

Figure 10:
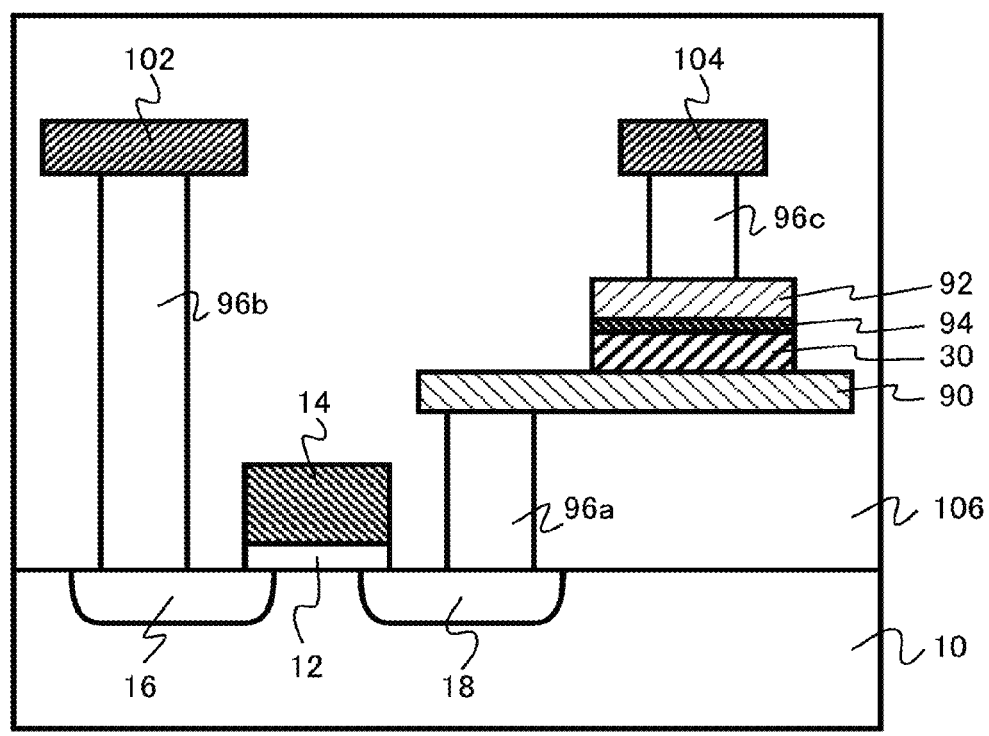
FIG. 10 is a schematic cross sectional view of a semiconductor device according to a fourth embodiment.

FIG. 10 is a schematic cross sectional view of the semiconductor device according to the present embodiment. The semiconductor device according to the present embodiment is a nonvolatile semiconductor device using a tunnel junction element including a ferroelectric substance.

The semiconductor device according to the present embodiment includes a semiconductor substrate 10, a gate insulating film 12 formed on the semiconductor substrate 10, and a gate electrode 14 formed on the gate insulating film 12. A source impurity layer 16 and a drain impurity layer 18 are formed on a surface of the semiconductor substrate 10 on both sides of the gate electrode 14. The semiconductor substrate 10, the gate insulating film 12, the gate electrode 14, the source impurity layer 16, and the drain impurity layer 18 constitute a transistor for selecting a memory cell. The gate electrode 14 functions as a word line of the FeRAM.

The semiconductor substrate 10 is formed, for example, of silicon (Si). The gate insulating film 12 is, for example, a silicon oxide film. The gate electrode 14 is formed, for example, of polycrystalline silicon doped with an impurity. The source impurity layer 16 and the drain impurity layer 18 are formed, for example, by diffusing arsenic (As) as an n-type impurity in the semiconductor substrate 10.

In addition, the semiconductor device according to the present embodiment includes a lower electrode (first conductive layer) 90 and an upper electrode (second conductive layer) 92. A dielectric film 30 is formed between the lower electrode 90 and the upper electrode 92. An insulating film 94 is provided between the dielectric film 30 and the upper electrode 92. The lower electrode 90, the dielectric film 30, the insulating film 94, and the upper electrode 92 constitute the tunnel junction element.

The lower electrode 90 and the upper electrode 92 are formed, for example, of conductive metal or a conductive metal compound. For example, the lower electrode 90 is formed of TiN (titanium nitride). For example, the upper electrode 92 is formed of Au (gold).

The dielectric film 30 is an oxide including Hf (hafnium) and/or Zr (zirconium). The dielectric film 30 is a ferroelectric film including a crystal structure similar to that of the first embodiment.

The insulating film 94 is a paraelectric film, and is formed, for example, of lanthanum aluminum oxide (LAO).

The drain impurity layer 18 and the lower electrode 90 are electrically connected to each other via a contact plug 96a. The semiconductor device according to the present embodiment includes a first bit line 102 and a second bit line 104. The first bit line 102 is electrically connected to the source impurity layer 16 via a contact plug 96b. The second bit line 104 is connected to the upper electrode 92 via a contact plug 96c. The first bit line 102, the second bit line 104, and the contact plugs 96a, 96b, and 96c are formed, for example, of conductive metal or a conductive metal compound.

An interlayer insulating film 106 is provided among the wiring, the electrodes, and the contact plugs. The interlayer insulating film 106 is, for example, a silicon oxide film.

At the time of writing, the FeRAM according to the present embodiment selects a memory cell with the word line and applies a voltage between the first bit line 102 and the second bit line 104 to thereby change a polarization direction of the dielectric film 30. At the time of reading, the FeRAM determines 1/0 with a pulse current value flowing between the first bit line 102 and the second bit line 104. The pulse current value changes depending on a polarization direction of the dielectric film 30.

According to the present embodiment, a semiconductor device including a dielectric film which can hold ferroelectricity even if reduced in thickness is realized. Therefore, a semiconductor device suitable for scaling-down is realized.

Fifth Embodiment

A semiconductor device according to the present embodiment is different from that in the first embodiment in that the semiconductor device according to the present embodiment is a nonvolatile semiconductor device using ferroelectric tunnel junction (FTJ) with a thin ferroelectric film. A dielectric film itself is similar to that in the first embodiment. Therefore, some contents overlapping with the first embodiment are not described.

Figure 11:
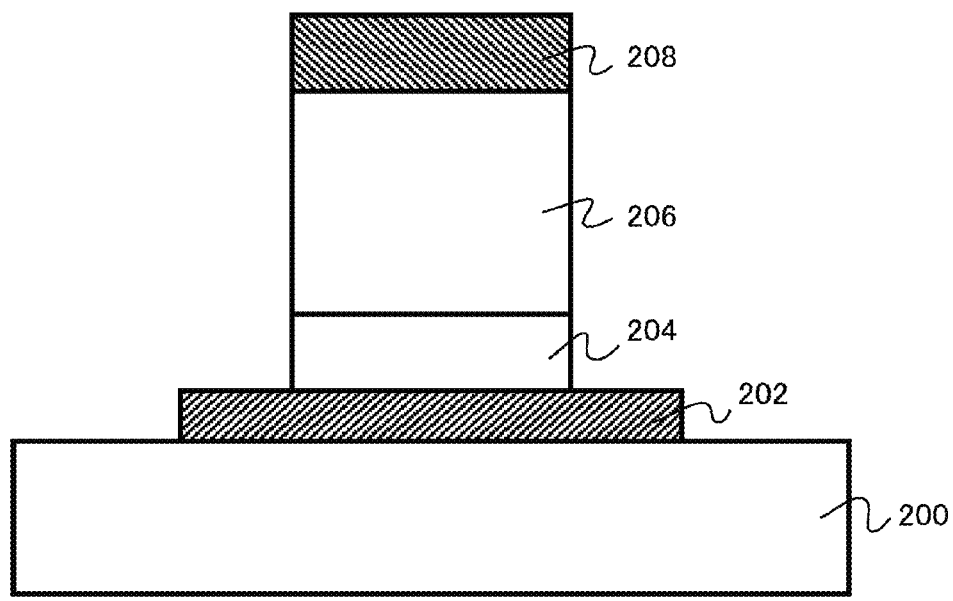
FIG. 11 is a schematic cross sectional view of a semiconductor device according to a fifth embodiment.

FIG. 11 is a schematic cross sectional view of the semiconductor device according to the present embodiment. The semiconductor device according to the present embodiment is a nonvolatile semiconductor device using a tunnel junction element including a ferroelectric substance.

The semiconductor device according to the present embodiment includes a substrate 200 and lower wiring 202 formed on the substrate 200. The semiconductor device according to the present embodiment includes a rectifier element 204 for selecting a memory on the lower wiring 202. The rectifier element 204 is not necessarily an essential component.

A resistance change element 206 is formed on the rectifier element 204, and upper wiring 208 is formed on the resistance change element 206. Each of the lower wiring 202 and the upper wiring 208 functions as a bit line or a word line. The semiconductor device according to the present embodiment is a nonvolatile semiconductor device including a cross point type memory cell.

Figure 12:
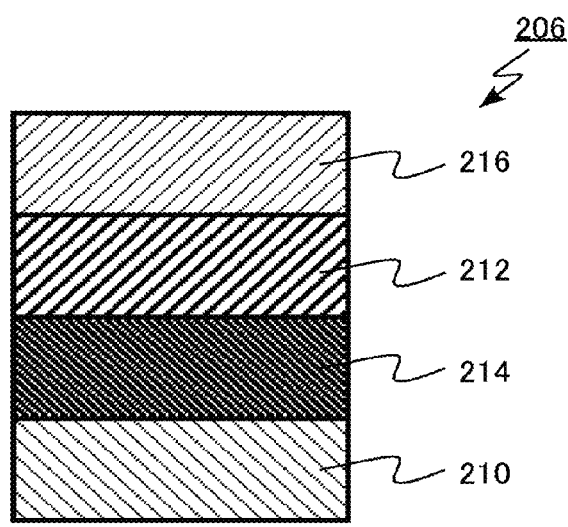
FIG. 12 is a schematic cross sectional view of a first structural example of a resistance change element according to the fifth embodiment.

FIG. 12 is a schematic cross sectional view of a first structural example of the resistance change element in the present embodiment. The resistance change element 206 includes a lower electrode 210, a second dielectric film 214 on the lower electrode 210, a first dielectric film 212 on the second dielectric film 214, and an upper electrode 216 on the first dielectric film 212.

The upper wiring 208 may also function as the upper electrode 216. The lower wiring 202 may also function as the lower electrode 210.

Figure 13:
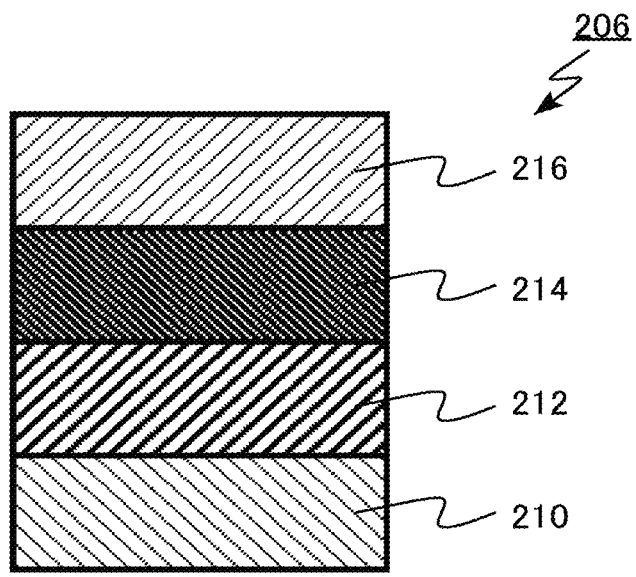
FIG. 13 is a schematic cross sectional view of a second structural example of the resistance change element according to the fifth embodiment.

FIG. 13 is a schematic cross sectional view of a second structural example of the resistance change element in the present embodiment. The resistance change element 206 includes the lower electrode 210, the first dielectric film 212 on the lower electrode 210, the second dielectric film 214 on the first dielectric film 212, and the upper electrode 216 on the second dielectric film 214.

The upper wiring 208 may also function as the upper electrode 216. The lower wiring 202 may also function as the lower electrode 210.

Figure 14:
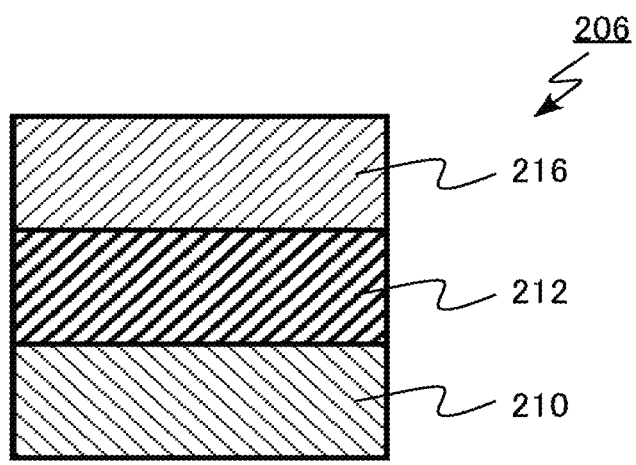
FIG. 14 is a schematic cross sectional view of a third structural example of the resistance change element according to the fifth embodiment.

FIG. 14 is a schematic cross sectional view of a third structural example of the resistance change element in the present embodiment. The resistance change element 206 includes the lower electrode 210, the first dielectric film 212 on the lower electrode 210, and the upper electrode 216 on the first dielectric film 212.

The upper electrode 216 and the lower electrode 210 are electrical conductors formed of different materials. The upper wiring 208 may also function as the upper electrode 216. The lower wiring 202 may also function as the lower electrode 210.

The lower electrode 210 and the upper electrode 216 are formed, for example, of conductive metal or a conductive metal compound in the first to third structural examples. For example, the lower electrode 210 is formed of TiN (titanium nitride). For example, the upper electrode 216 is formed of Ta (tantalum).

The first dielectric film 212 is an oxide including Hf (hafnium) and/or Zr (zirconium). The dielectric film 30 is a ferroelectric film including a crystal structure similar to that of the first embodiment.

The second dielectric film 214 is a paraelectric film, and is formed, for example, of lanthanum aluminum oxide (LAO).

At the time of writing, the memory according to the present embodiment selects a memory cell with the word line and the bit line, and applies a voltage between the word line and the bit line to thereby change a polarization direction of the first dielectric film 212. At the time of reading, the memory determines 1/0 with a current value flowing between the bit line and the word line. The pulse current value changes depending on a polarization direction of the dielectric film 30.

When using the rectifier element 204 in the present embodiment, it is possible to prevent a current from flowing in other parts than the memory cell selected with the word line and the bit line.

On the other hand, when the rectifier element 204 is not used in the present embodiment, the resistance change element 206 itself in the first to third structural examples is made to have a rectifying function. It is possible to simplify the memory structure by using such a structure. Therefore, a structure more suitable for increasing a capacity is obtained.

According to the present embodiment, a semiconductor device including a dielectric film which can hold ferroelectricity even if reduced in thickness is realized. Therefore, a semiconductor device suitable for scaling-down is realized.

Sixth Embodiment

A semiconductor device according to the present embodiment is similar to that in the first to fifth embodiment except that not a ferroelectric substance but a ferrielectric substance is used for the dielectric film in the semiconductor device according to the present embodiment. Therefore, some contents overlapping with the first to fifth embodiment are not described.

In the present embodiment, for example, the dielectric film 30 includes first orthorhombic crystals Pbca (space group number 61) and $Pbc2_1$ (space group number 29) having a superlattice structure of a two-fold cycle including $Pbc2_1$ as an original unit lattice.

The dielectric film 30 is, for example, formed of hafnium oxide including Sr (strontium). This film includes first orthorhombic crystals Pbca (space group number 61) and $Pbc2_1$ having a superlattice structure of a two-fold cycle including $Pbc2_1$ as an original unit lattice when a total energy is estimated with first principle calculation.

In both a film subjected to macroscopic phase separation into $Pbc2_1$ and Pbca and a film in which $Pbc2_1$ and Pbca are mixed microscopically in a unit of a few atom layers, the film approaches a ferrielectric substance when a ratio of $Pbc2_1$ is high, and the film approaches an antiferroelectric substance as a ratio of Pbca becomes higher. In view of electric characteristics, the film has spontaneous polarization also in the ferrielectric substance. Therefore, except for a case where the film includes completely only Pbca, the film functions effectively as a dielectric film of a nonvolatile memory device.

When $Pbc2_1$ and Pbca are microscopically stacked in layers, it can be assumed that a superlattice structure of a long cycle is realized. The mixed film of $Pbc2_1$ and Pbca is not necessarily limited to a film formed of hafnium oxide including Sr. According to the first principle calculation, when the mixed film is formed of hafnium oxide including Sr, energies of $Pbc2_1$ and Pbca are closest to each other. However, also when the mixed film is formed of hafnium oxide including Si(Silicon), or the like, the energies of $Pbc2_1$ and Pbca are very close to each other, and a similar mixed situation can be realized.

According to the present embodiment, a semiconductor device including a dielectric film which can hold ferrielectricity even if reduced in thickness is realized. Therefore, a semiconductor device suitable for scaling-down is realized.

EXAMPLES

Hereinafter, examples of the present disclosure will be described.

Example 1

A capacitor to be formed of a first conductive layer, a dielectric film, and a second conductive layer was manufactured with the following method.

A silicon substrate in which a (100) surface had been exposed was subjected to RCA cleaning, and a TiN film having a thickness of 8 nm was formed thereon by sputtering as the first conductive layer. The maximum range of protrusions and recesses on the surface was made to be 0.15 nm or more and 1.0 nm or less.

Subsequently, a hafnium oxide film was formed on the TiN film as the dielectric film with a sputtering method by a multi-chamber process. When an atomic concentration of Hf (hafnium) in the hafnium oxide film and an atomic concentration of O (oxygen) therein were q and r, respectively, the sputtering conditions were adjusted so as to be $1.95 \leq r \div q \leq 1.99$.

Subsequently, a TiN film having a thickness of 8 nm was formed on the hafnium oxide film as the second conductive layer with sputtering by the multi-chamber process. The maximum range of protrusions and recesses on the surface was made to be 0.15 nm or more and 1.0 nm or less. Subsequently, a Ta film having a thickness of 50 nm was formed with sputtering by the multi-chamber process.

Thereafter, a heat treatment at 1000° C. was performed by flash lamp annealing to crystallize the hafnium oxide film. The heat treatment was performed under such a condition that the time at 850° C. or higher was 10 milliseconds or less. A temperature change at the time of temperature fall to 800° C. was made to be $2 \times 10^{5}$° C./s or more. Furthermore, a gate electrode pattern was formed by applying a resist on the film. Thereafter, the upper electrode was separated while the upper electrode was locally left with RIE processing.

By analyzing the dielectric film with an X-ray diffraction method, lattice constants of the film (the axis lengths a, b, and c as defined above) were as follows. That is, (a, b, c, c/a, a/b, c/b)=(0.5069, 0.5226, 0.5075, 1.0011, 0.9699, 0.9711). When (p, x, y, z, u, v, w)=(1, 0.5047, 0.5243, 0.5065, 1.0037, 0.9627, 0.9661), (x−a, y−b, z−c, u−c/a, v−a/b, w−c/b)=(−0.0022, 0.0017, −0.0010, 0.0026, −0.0072, −0.0050). These satisfy the above-described formulae (1) to (13).

By evaluating the capacitor formed of the first conductive layer, the dielectric film, and the second conductive layer, formed in this way, a high spontaneous polarization value of 0.5000 C/m² was obtained. This value is lower than a value predicted by the first principle calculation. Therefore, further improvement in characteristics can be expected, for example, by improving the method for manufacturing the dielectric film.

Example 2

A capacitor to be formed of a first conductive layer, a dielectric film, and a second conductive layer was manufactured with a similar method to that in Example 1 except for adding Y (yttrium) to a hafnium oxide film.

By analyzing the dielectric film with an X-ray diffraction method, lattice constants of the film (the axis lengths a, b, and c as defined above) were as follows. That is, (a, b, c, c/a, a/b, c/b)=(0.5120, 0.5155, 0.5120, 1.0000, 0.9932, 0.9932). When (p, x, y, z, u, v, w)=(1, 0.5047, 0.5243, 0.5066, 1.0037, 0.9627, 0.9661), (x−a, y−b, z−c, u−c/a, v−a/b, w−c/b)=(−0.0073, 0.0088, −0.0055, 0.0037, −0.0305, −0.0271) These satisfy the above-described formulae (1) to (13).

By evaluating the capacitor formed of the first conductive layer, the dielectric film, and the second conductive layer, a high spontaneous polarization value of 0.5000 C/m² was obtained. This value is lower than a value predicted by the first principle calculation. Therefore, further improvement in characteristics can be expected, for example, by improving the method for manufacturing the dielectric film.

Hitherto, the embodiments have exemplified mainly the dielectric film formed of hafnium oxide. However, the dielectric film may be formed of zirconium oxide. In addition, the dielectric film may be formed of an oxide including both hafnium and zirconium.

While certain embodiments have been described, these embodiments have been presented by way of example only, and are not intended to limit the scope of the inventions. Indeed, the semiconductor device and the dielectric film described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a first conductive layer;
a second conductive layer; and
a dielectric film provided between the first conductive layer and the second conductive layer in cross-sectional view, the dielectric film including a fluorite-type crystal, wherein
a positive ion site of the fluorite-type crystal includes at least one of Hf (hafnium) and Zr (zirconium), and a negative ion site of the fluorite-type crystal includes O (oxygen), and
following formulae (1) to (13) are satisfied in the fluorite-type crystal, when, among three axes of an original unit cell of the crystal, an axis in a direction with no reversal symmetry is c-axis, a stacking direction of atomic planes of two kinds formed by negative ions disposed at different positions is a-axis, remainder is b-axis, axis length of the a-axis of the original unit cell is a, axis length of the b-axis thereof is b, axis length of the c-axis thereof is c, a parameter is p, and x, y, z, u, v and w are values represented using the parameter p $$x = 0.0000077293 \times p \times p - 0.00091484 \times p + 0.50556 \quad (1)$$

$$y = 0.0000089659 \times p \times p - 0.00082246 \times p + 0.52512 \quad (2)$$

$$z = -0.000012625 \times p \times p - 0.00045149 \times p + 0.50696 \quad (3)$$

$$u = -0.000042665 \times p \times p + 0.00097971 \times p + 1.0028 \quad (4)$$

$$v = -0.00032701 \times p + 0.96306 \quad (5)$$

$$w = -0.000042194 \times p \times p + 0.00068404 \times p + 0.96543 \quad (6)$$

$$-0.0074 \leq x - a \leq 0.026 \quad (7)$$

$$-0.0075 \leq y - b \leq 0.026 \quad (8)$$

$$-0.0056 \leq z - c \leq 0.006 \quad (9)$$

$$-0.063 \leq u - c \div a \leq 0.0055 \quad (10)$$

$$-0.031 \leq v - a \div b \leq 0.0024 \quad (11)$$

$$-0.077 \leq w - c \div b \leq 0.006 \quad (12)$$

$$1 \leq p \leq 40 \quad (13).$$

2. The device according to claim 1, wherein
following relation is satisfied when an atomic concentration of Hf (hafnium) and an atomic concentration of O (oxygen) in the dielectric film are q and r, respectively $1.95 \leq r \div q \leq 1.99$.

3. The device according to claim 1, wherein
following relation is satisfied when the dielectric film includes at least one element selected from a group consisting of Zr, Si, Y, Al, Sr, La, Ce, Pr, Nd, Sm, Eu, Gd, Tb, Dy, Ho, Er, Tm, Yb, Lu, F, Cl, and N, a total atomic concentration of the element of the group included in the dielectric film is s, and an atomic concentration of Hf is q $0.01 \leq s \div (q+s) \leq 0.2$.

4. The device according to claim 1, wherein
following relation is satisfied when the dielectric film includes Hf (hafnium) and Zr (zirconium), and an atomic concentration of Hf (hafnium) and an atomic concentration of Zr are q and t, respectively $0.4 \leq q \div (q+t) \leq 0.6$.

5. The device according to claim 1, wherein
following relation is satisfied when the dielectric film includes Zr (zirconium), and an atomic concentration of Zr and an atomic concentration of O (oxygen) are t and r, respectively $1.95 \leq r \div t \leq 2, 4 \leq p \leq 40$.

6. The device according to claim 1, wherein
maximum range of protrusions and recesses on an interface between the first conductive layer and the dielectric film or maximum range of protrusions and recesses on an interface between the second conductive layer and the dielectric film is 0.15 nm or more and 1.0 nm or less.

7. A dielectric film comprising a fluorite-type crystal, wherein
a positive ion site of the fluorite-type crystal includes at least one of Hf (hafnium) and Zr (zirconium), and a negative ion site of the fluorite-type crystal includes O (oxygen), and
following formulae (1) to (13) are satisfied in the fluorite-type crystal, when, among three axes of an original unit cell of the crystal, an axis in a direction with no reversal symmetry is c-axis, a stacking direction of atomic planes of two kinds formed by negative ions disposed at different positions is a-axis, remainder is b-axis, axis length of the a-axis of the original unit cell is a, axis length of the b-axis thereof is b, axis length of the c-axis thereof is c, a parameter is p, and x, y, z, u, v and w are values represented using the parameter p $x = 0.0000077293 \times p \times p - 0.00091484 \times p + 0.50556$ (1)

$y = 0.0000089659 \times p \times p - 0.00082246 \times p + 0.52512$ (2)

$z = -0.000012625 \times p \times p - 0.00045149 \times p + 0.50696$ (3)

$u = -0.000042665 \times p \times p + 0.00097971 \times p + 1.0028$ (4)

$v = -0.00032701 \times p + 0.96306$ (5)

$w = -0.000042194 \times p \times p + 0.00068404 \times p + 0.96543$ (6)

$-0.0074 \leq x - a \leq 0.026$ (7)

$-0.0075 \leq y - b \leq 0.026$ (8)

$-0.0056 \leq z - c \leq 0.006$ (9)

$-0.063 \leq u - c \div a \leq 0.0055$ (10)

$-0.031 \leq v - a \div b \leq 0.0024$ (11)

$-0.077 \leq w - c \div b \leq 0.006$ (12)

$1 \leq p \leq 40$ (13).

8. The dielectric film according to claim 7, wherein
following relation is satisfied when an atomic concentration of Hf (hafnium) and an atomic concentration of O (oxygen) in the dielectric film are q and r, respectively $1.95 \leq r \div q \leq 1.99$.

9. The dielectric film according to claim 7, wherein
following relation is satisfied when the dielectric film includes at least one element selected from a group consisting of Zr, Si, Y, Al, Sr, La, Ce, Pr, Nd, Sm, Eu, Gd, Tb, Dy, Ho, Er, Tm, Yb, Lu, F, Cl, and N, a total atomic concentration of the element of the group included in the dielectric film is s, and an atomic concentration of Hf is q $0.01 \leq s \div (q+s) \leq 0.2$.

10. The dielectric film according to claim 7, wherein
following relation is satisfied when the dielectric film includes Hf (hafnium) and Zr (zirconium), and an atomic concentration of Hf (hafnium) and an atomic concentration of Zr are q and t, respectively $0.4 \leq q \div (q+t) \leq 0.6$.

11. The dielectric film according to claim 7, wherein
following relation is satisfied when the dielectric film includes Zr (zirconium), and an atomic concentration of Zr and an atomic concentration of O (oxygen) are t and r, respectively $1.95 \leq r \div t \leq 2, 4 \leq p \leq 40$.

12. A semiconductor device comprising:
a semiconductor layer;
a conductive layer; and
a first dielectric film provided between the semiconductor layer and the conductive layer in cross-sectional view, the first dielectric film including a fluorite-type crystal, wherein
a positive ion site of the fluorite-type crystal includes at least one of Hf (hafnium) and Zr (zirconium), and a negative ion site of the fluorite-type crystal includes O (oxygen), and
following formulae (1) to (13) are satisfied in the fluorite-type crystal, when, among three axes of an original unit cell of the crystal, an axis in a direction with no reversal symmetry is c-axis, a stacking direction of atomic planes of two kinds formed by negative ions disposed at different positions is a-axis, remainder is b-axis, axis length of the a-axis of the original unit cell is a, axis length of the b-axis thereof is b, axis length of the c-axis thereof is c, a parameter is p, and x, y, z, u, v and w are values represented using the parameter p $x = 0.0000077293 \times p \times p - 0.00091484 \times p + 0.50556$ (1)

$y = 0.0000089659 \times p \times p - 0.00082246 \times p + 0.52512$ (2)

$z = -0.000012625 \times p \times p - 0.00045149 \times p + 0.50696$ (3)

$u = -0.000042665 \times p \times p + 0.00097971 \times p + 1.0028$ (4)

$$v = -0.00032701 \times p + 0.96306 \quad (5)$$

$$w = -0.000042194 \times p \times p + 0.00068404 \times p + 0.96543 \quad (6)$$

$$-0.0074 \leq x - a \leq 0.026 \quad (7)$$

$$-0.0075 \leq y - b \leq 0.026 \quad (8)$$

$$-0.0056 \leq z - c \leq 0.006 \quad (9)$$

$$-0.063 \leq u - c + a \leq 0.0055 \quad (10)$$

$$-0.031 \leq v - a + b \leq 0.0024 \quad (11)$$

$$-0.077 \leq w - c + b \leq 0.006 \quad (12)$$

$$1 \leq p \leq 40 \quad (13).$$

13. The device according to claim 12, further comprising: a second dielectric film provided between the semiconductor layer and the first dielectric film.

14. The device according to claim 12, further comprising: a source region and a drain region provided at a surface of the semiconductor layer on both sides of the conductive layer.

\* \* \* \* \*